(12) United States Patent
Ikeda et al.

(10) Patent No.: US 11,088,698 B2
(45) Date of Patent: Aug. 10, 2021

(54) PHASE-LOCKED LOOP CIRCUIT

(71) Applicant: MITSUBISHI ELECTRIC CORPORATION, Tokyo (JP)

(72) Inventors: Sho Ikeda, Tokyo (JP); Akihito Hirai, Tokyo (JP); Koji Tsutsumi, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/107,382

(22) Filed: Nov. 30, 2020

(65) Prior Publication Data

US 2021/0083681 A1    Mar. 18, 2021

Related U.S. Application Data

(63) Continuation of application No. PCT/JP2018/026039, filed on Jul. 10, 2018.

(51) Int. Cl.
*H03L 7/197* (2006.01)
*H03L 7/085* (2006.01)

(52) U.S. Cl.
CPC .............. *H03L 7/197* (2013.01); *H03L 7/085* (2013.01)

(58) Field of Classification Search
CPC ...................................................... H03L 7/197
See application file for complete search history.

(56) References Cited

PUBLICATIONS

Nakamizo et al., "Phase difference control circuit of fractional-N PLL without reset timing control", IEICE, C-2-102, Nagoya, Mar. 22-25, 2017, p. 115, total of 3 pages.
Tajima et al., "Frequency and Phase Difference Control Using Fractional-N PLL Synthesizers by Composition of Control Data", IEEE Transactions on Microwave Theory and Techniques, vol. 55, No. 12, Dec. 2007, pp. 2832-2838.

*Primary Examiner* — Patrick O Neill
(74) *Attorney, Agent, or Firm* — Birch, Stewart, Kolasch & Birch, LLP

(57) ABSTRACT

A phase-locked loop circuit includes: a division ratio control circuit controlling a division ratio of an output signal of a variable frequency divider on the basis of an addition signal of a negative feedback signal and a division ratio setting signal indicating the division ratio, in synchronization with a divided signal output from the variable frequency divider; a first phase detection circuit calculating a first phase detection signal indicating a phase of an output signal of a signal output circuit; a second phase detection circuit calculating a second phase detection signal indicating a phase of the output signal of a case where it is assumed that the division ratio control circuit controls the division ratio of the output signal of the variable frequency divider in synchronization with the reference signal; and a shift circuit generating a negative feedback signal from a difference between the first phase detection signal and the second phase detection signal, and outputting an addition signal of the generated negative feedback signal and the division ratio setting signal to the division ratio control circuit.

13 Claims, 13 Drawing Sheets

(When L = 4, M = 9, N_frac = 0.25, and Division Ratio = M/L = 2.25)

PHASE-LOCKED LOOP CIRCUIT

CROSS REFERENCE TO RELATED APPLICATION

This application is a Continuation of PCT International Application No. PCT/JP2018/026039, filed on Jul. 10, 2018, which is hereby expressly incorporated by reference into the present application.

TECHNICAL FIELD

The present invention relates to a phase-locked loop circuit for outputting a signal having a frequency corresponding to a phase difference between a reference signal and a divided signal.

BACKGROUND ART

A phase-locked loop circuit includes a phase comparator for detecting a phase difference between a reference signal and a divided signal output from a variable frequency divider, and a charge pump for outputting a current directly proportional to the phase difference detected by the phase comparator.

Furthermore, the phase-locked loop circuit includes a loop filter for converting the output current of the charge pump into a voltage signal and applying the voltage signal to a frequency control terminal of a voltage controlled oscillator (hereinafter referred to as a "VCO"), and the VCO for outputting a signal having a frequency corresponding to the voltage signal.

Moreover, the phase-locked loop circuit includes the variable frequency divider for dividing an output signal of the VCO and outputting a divided signal of the output signal to the phase comparator.

In the phase-locked loop circuit, a $\Delta\Sigma$ modulator can equivalently implement fractional division by randomly modulating a division ratio of the variable frequency divider.

A pattern of a division ratio control signal output from the $\Delta\Sigma$ modulator to the variable frequency divider corresponds to a phase of the output signal of the VCO, and if the pattern of the division ratio control signal can be controlled, the phase of the output signal of the VCO can be controlled.

Non-Patent Literature 1 below discloses a method of controlling the pattern of the division ratio control signal by adding a signal corresponding to an amount of phase control to be implemented to an input signal of the $\Delta\Sigma$ modulator.

CITATION LIST

Non-Patent Literature

Non-Patent Literature 1: Hideyuki Nakamizo, Kenichi Tajima "Phase difference control circuit of fractional-N PLL without reset timing control" IEICE General Conference, C-2-102, March 2017

SUMMARY OF INVENTION

Technical Problem

If the method disclosed in Non-Patent Literature 1 is used, the pattern of the division ratio control signal can be controlled in the phase-locked loop circuit.

However, even if the input signal of the $\Delta\Sigma$ modulator is the same, the pattern of the division ratio control signal output from the $\Delta\Sigma$ modulator is not always the same, and any one of a plurality of patterns corresponding to one input signal is output from the $\Delta\Sigma$ modulator.

If the pattern of the division ratio control signal output from the $\Delta\Sigma$ modulator is different, the phase of the output signal of the VCO is different.

Thus, in a communication apparatus or the like in which a plurality of phase-locked loop circuits having the same configuration is mounted, even if the same input signal is given to $\Delta\Sigma$ modulators of the respective phase-locked loop circuits, there is a case where the phases of the output signals of the plurality of phase-locked loop circuits are different from each other. There has been a problem that, as a result of the phase difference in the output signals of the plurality of phase-locked loop circuits, malfunction occurs in some cases.

The present invention has been made to solve the problem as described above, and an object of the present invention is to obtain a phase-locked loop circuit capable of outputting an output signal having the same phase as a phase of an output signal of another phase-locked loop circuit having the same configuration.

Solution to Problem

A phase-locked loop circuit according to the present invention includes: a division ratio control circuit controlling a division ratio of a divided signal to be output by a variable frequency divider on a basis of an addition signal in which a negative feedback signal is added to a division ratio setting signal indicating a division ratio, in synchronization with the divided signal output from the variable frequency divider; a first phase detection circuit calculating a first phase detection signal indicating a phase of an output signal of a signal output circuit; a second phase detection circuit calculating a second phase detection signal indicating a phase of the output signal of the variable frequency divider in a case where it is assumed that the division ratio control circuit controls the division ratio of the divided signal to be output by the variable frequency divider in synchronization with the a signal; and a shift circuit generating the negative feedback signal from a difference between the first phase detection signal and the second phase detection signal, and outputting the addition signal of the negative feedback signal and the division ratio setting signal to the division ratio control circuit.

Advantageous Effects of Invention

According to the present invention, the phase-locked loop circuit includes: a division ratio control circuit controlling a division ratio of a divided signal to be output by a variable frequency divider on a basis of an addition signal in which a negative feedback signal is added to a division ratio setting signal indicating a division ratio, in synchronization with the divided signal output from the variable frequency divider; a first phase detection circuit calculating a first phase detection signal indicating a phase of an output signal of a signal output circuit; a second phase detection circuit calculating a second phase detection signal indicating a phase of the output signal of the variable frequency divider in a case where it is assumed that the division ratio control circuit controls the division ratio of the divided signal to be output by the variable frequency divider in synchronization with the a signal; and a shift circuit generating the negative feedback signal from a difference between the first phase detection signal and the second phase detection signal, and outputting the addition signal of the negative feedback signal and the division ratio setting signal to the division ratio control circuit. Thus, the phase-locked loop circuit according to the present invention can output an output signal having the same phase as a phase of an output signal of another phase-locked loop circuit having the same configuration.

DESCRIPTION OF EMBODIMENTS

Hereinafter, to explain the present invention in more detail, embodiments for carrying out the present invention will be described with reference to the accompanying drawings.

First Embodiment

Figure 1:
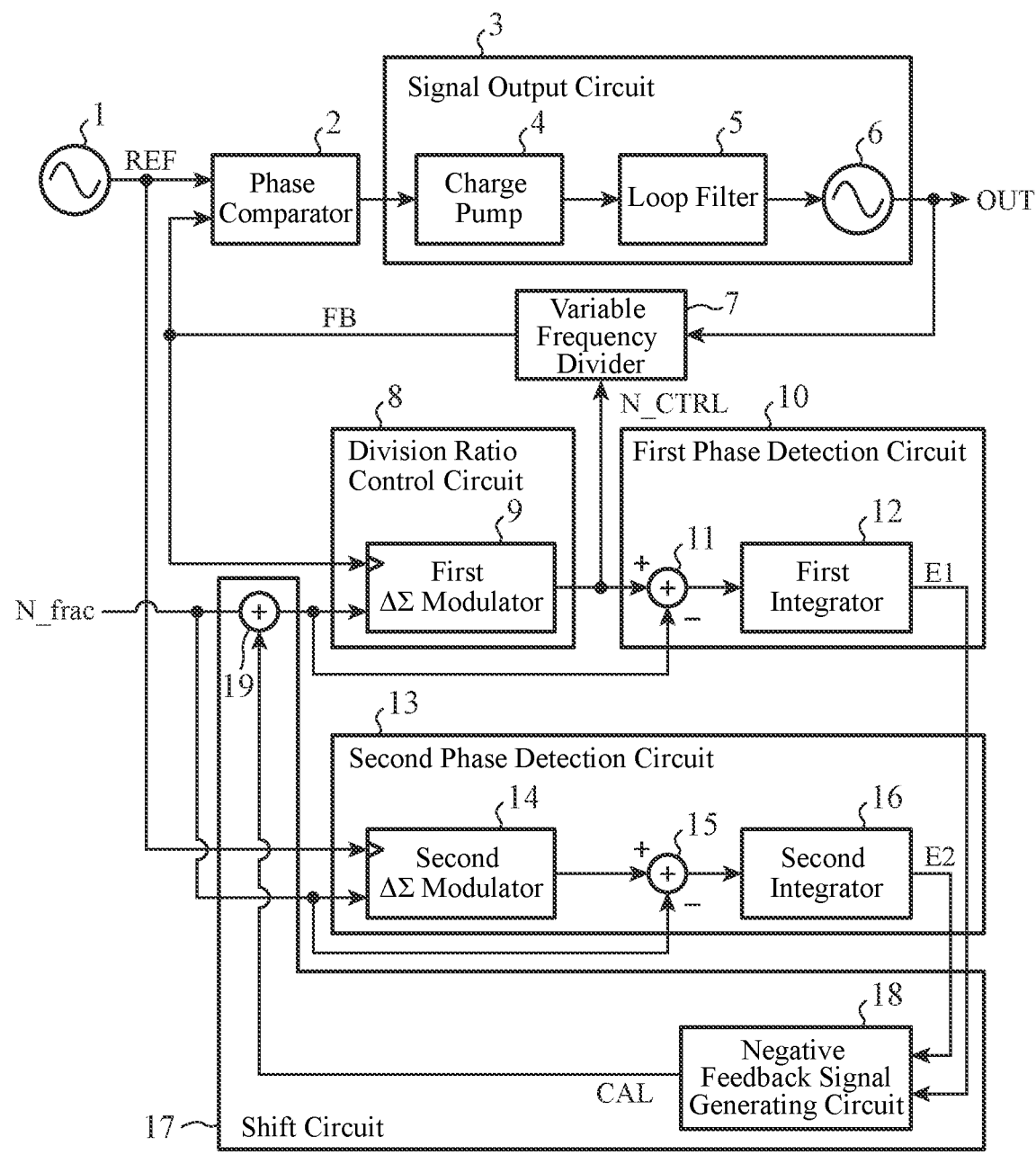
FIG. 1 is a configuration diagram illustrating a phase-locked loop circuit according to a first embodiment.

FIG. 1 is a configuration diagram illustrating a phase-locked loop circuit according to a first embodiment.

In FIG. 1, a signal source 1 outputs a reference signal REF to each of a phase comparator 2 and a second ΔΣ modulator 14.

The phase comparator 2 detects a phase difference Δθ between the reference signal REF output from the signal source 1 and a divided signal FB output from a variable frequency divider 7, and outputs an error signal indicating the phase difference Δθ to a charge pump 4.

A signal output circuit 3 includes the charge pump 4, a loop filter 5, and a voltage controlled oscillator (VCO) 6.

The signal output circuit 3 outputs a signal having a frequency corresponding to the error signal output from the phase comparator 2 (hereinafter, referred to as an "output signal OUT") to each of the outside and the variable frequency divider 7.

The charge pump 4 outputs, to the loop filter 5, a current directly proportional to the error signal output from the phase comparator 2.

The loop filter 5 is implemented by a low pass filter or the like.

The loop filter 5 converts the output current of the charge pump 4 into a DC voltage and applies the DC voltage to a frequency control terminal of the VCO 6.

The VCO 6 outputs the output signal OUT having a frequency corresponding to the DC voltage applied to the frequency control terminal to each of the outside and the variable frequency divider 7.

In the variable frequency divider 7, a division ratio is set in accordance with a division ratio control signal N_CTRL output from a first ΔΣ modulator 9.

The variable frequency divider 7 divides the output signal OUT of the VCO 6 by the division ratio set by the division ratio control signal N_CTRL, and outputs the divided signal FB of the output signal OUT to each of the phase comparator 2 and the first ΔΣ modulators 9.

A division ratio control circuit 8 includes the first ΔΣ modulator 9.

The division ratio control circuit 8 controls the division ratio of the output signal OUT of the variable frequency divider 7 on the basis of an addition signal output from an adder 19, in synchronization with the divided signal FB output from the variable frequency divider 7.

The first ΔΣ modulator 9 generates a first pulse train for controlling the division ratio of the output signal OUT of the variable frequency divider 7 by performing ΔΣ modulaton of the addition signal output from the adder 19, in synchronization with the divided signal FB output from the variable frequency divider 7.

The first ΔΣ modulator 9 outputs the first pulse train as the division ratio control signal N_CTRL to each of the variable frequency divider 7 and a first subtractor 11.

Note that, the first pulse train generated by the first ΔΣ modulator 9 means a concept including not only a series of pulses having a signal level of "1" or "0" but also a series of multi-bit digital signals.

A first phase detection circuit 10 includes the first subtractor 11 and a first integrator 12.

The first phase detection circuit 10 calculates a first phase detection signal E1 indicating a phase of the output signal OUT of the VCO 6, and outputs the first phase detection signal E1 to a negative feedback signal generating circuit 18.

The first subtractor 11 subtracts the addition signal output from the adder 19 from the first pulse train output from the first ΔΣ modulator 9, and outputs a subtraction signal indicating a result of the subtraction to the first integrator 12.

The first integrator 12 calculates the first phase detection signal E1 by integrating the subtraction signal output from the first subtractor 11, and outputs the first phase detection signal E1 to the negative feedback signal generating circuit 18.

A second phase detection circuit 13 includes the second ΔΣ modulator 14, a second subtractor 15, and a second integrator 16.

The second phase detection circuit 13 calculates a second phase detection signal E2 indicating a phase of the output signal OUT of a case where it is assumed that the first ΔΣ modulator 9 controls the division ratio of the output signal OUT of the variable frequency divider 7 in synchronization with the reference signal REF.

The second phase detection circuit 13 outputs the second phase detection signal E2 to the negative feedback signal generating circuit 18.

The second ΔΣ modulator 14 generates a second pulse train by performing ΔΣ modulation of a division ratio setting signal N_frac indicating the division ratio, in synchronization with the reference signal REF output from the signal source 1, and outputs the second pulse train to the second subtractor 15.

Note that, the second pulse train generated by the second ΔΣ modulator 14 means a concept including not only a series of pulses having a signal level of "1" or "0" but also a series of multi-bit digital signals.

The second subtractor 15 subtracts the division ratio setting signal N_frac from the second pulse train output from the second ΔΣ modulator 14, and outputs a subtraction signal indicating a result of the subtraction to the second integrator 16.

The second integrator 16 calculates the second phase detection signal E2 by integrating the subtraction signal output from the second subtractor 15, and outputs the second phase detection signal E2 to the negative feedback signal generating circuit 18.

A shift circuit 17 includes the negative feedback signal generating circuit 18 and the adder 19.

The shift circuit 17 generates a negative feedback signal CAL from a difference between the first phase detection signal E1 output from the first integrator 12 and the second phase detection signal E2 output from the second integrator 16.

The shift circuit 17 outputs an addition signal of the generated negative feedback signal CAL and the division ratio setting signal N_frac to each of the first ΔΣ modulator 9 and the first subtractor 11.

The negative feedback signal generating circuit 18 generates the negative feedback signal CAL from the difference between the first phase detection signal E1 output from the first integrator 12 and the second phase detection signal E2 output from the second integrator 16, and outputs the negative feedback signal CAL to the adder 19.

The adder 19 adds the division ratio setting signal N_frac and the negative feedback signal CAL output from the negative feedback signal generating circuit 18 together, and outputs the addition signal of the division ratio setting signal N_frac and the negative feedback signal CAL to each of the first ΔΣ modulator 9 and the first subtractor 11.

Next, the operation of the phase-locked loop circuit illustrated in FIG. 1 will be described.

The signal source 1 outputs the reference signal REF to each of the phase comparator 2 and the second ΔΣ modulator 14.

Upon receiving the reference signal REF from the signal source 1 and the divided signal FB from the variable frequency divider 7, the phase comparator 2 detects the phase difference Δθ between the reference signal REF and the divided signal FB, and outputs the error signal indicating the phase difference Δθ to the charge pump 4.

Upon receiving the error signal from the phase comparator 2, the charge pump 4 outputs the current directly proportional to the error signal to the loop filter 5.

The loop filter 5 converts the output current of the charge pump 4 into the DC voltage and applies the DC voltage to the frequency control terminal of the VCO 6.

When the DC voltage is applied to the frequency control terminal by the loop filter 5, the VCO 6 outputs the output signal OUT having the frequency corresponding to the DC voltage to each of the outside and the variable frequency divider 7.

In the variable frequency divider 7, the division ratio is set by the division ratio control signal N_CTRL output from the first ΔΣ modulator 9.

The variable frequency divider 7 divides the output signal OUT of the VCO 6 by the division ratio set by the division ratio control signal N_CTRL, and outputs the divided signal FB of the output signal OUT to each of the phase comparator 2 and the first ΔΣ modulators 9.

The adder 19 adds the division ratio setting signal N_frac and the negative feedback signal CAL output from the negative feedback signal generating circuit 18 together. The division ratio setting signal N_frac is a signal indicating a fixed division ratio given from the outside.

The adder 19 outputs the addition signal of the division ratio setting signal N_frac and the negative feedback signal CAL to each of the first ΔΣ modulator 9 and the first subtractor 11.

The first ΔΣ modulator 9 generates the first pulse train for controlling the division ratio of the output signal OUT of the variable frequency divider 7 by performing the ΔΣ modulaton of the addition signal output from the adder 19, in synchronization with the divided signal FB output from the variable frequency divider 7.

The first ΔΣ modulator 9 outputs the first pulse train as the division ratio control signal N_CTRL to each of the variable frequency divider 7 and the first subtractor 11.

The first subtractor 11 subtracts the addition signal output from the adder 19 from the first pulse train output from the first ΔΣ modulator 9, and outputs the subtraction signal indicating the result of the subtraction to the first integrator 12.

The first integrator 12 calculates the first phase detection signal E1 by integrating the subtraction signal output from the first subtractor 11, and outputs the first phase detection signal E1 to the negative feedback signal generating circuit 18.

Here, the subtraction signal output from the first subtractor 11 corresponds to a quantization error of the ΔΣ modulaton of the first ΔΣ modulator 9. Furthermore, the quantization error of the ΔΣ modulaton corresponds to an instantaneous value of the phase difference Δθ indicated by the error signal output from the phase comparator 2, as illustrated in FIG. 2.

Figure 2:
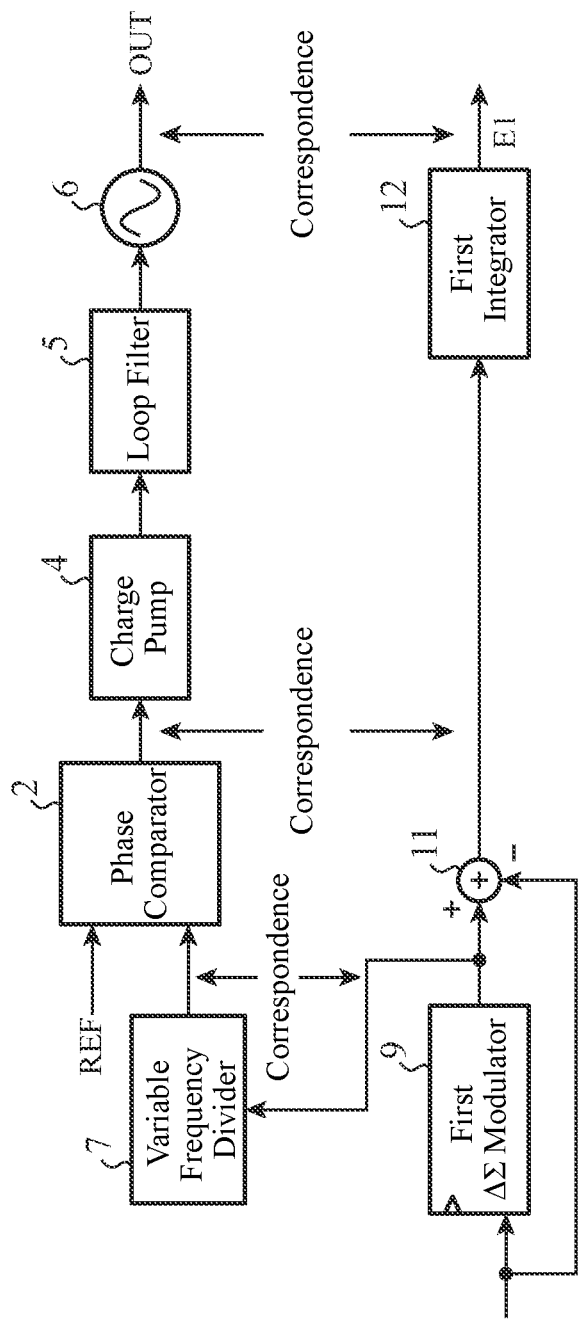
FIG. 2 is an explanatory diagram illustrating that a quantization error of ΔΣ modulation of a first ΔΣ modulator 9 and an instantaneous value of a phase difference Δθ detected by a phase comparator 2 correspond to each other, and a phase of an output signal OUT and a phase indicated by a first phase detection signal E1 correspond to each other.

FIG. 2 is an explanatory diagram illustrating that the quantization error of the ΔΣ modulaton of the first ΔΣ modulator 9 and the instantaneous value of the phase difference Δθ detected by the phase comparator 2 correspond to each other, and the phase of the output signal OUT and a phase indicated by the first phase detection signal E1 correspond to each other.

In the signal output circuit 3, the loop filter 5 generates the phase of the output signal OUT of the VCO 6 by smoothing the instantaneous value of the phase difference Δθ detected by the phase comparator 2. Thus, the first integrator 12 can calculate the first phase detection signal E1 indicating the phase of the output signal OUT by integrating the subtraction signal corresponding to the quantization error.

The second ΔΣ modulator 14 generates the second pulse train by performing the ΔΣ modulaton of the division ratio setting signal N_frac, in synchronization with the reference signal REF output from the signal source 1, and outputs the second pulse train to the second subtractor 15.

The second subtractor 15 subtracts the division ratio setting signal N_frac from the second pulse train output from the second ΔΣ modulator 14, and outputs the subtraction signal indicating the result of the subtraction to the second integrator 16.

The second integrator 16 calculates the second phase detection signal E2 by integrating the subtraction signal output from the second subtractor 15, and outputs the second phase detection signal E2 to the negative feedback signal generating circuit 18.

Here, the subtraction signal output from the second subtractor 15 corresponds to the quantization error of the ΔΣ modulaton of the second ΔΣ modulator 14. The second ΔΣ modulator 14 performs the ΔΣ modulaton of the division ratio setting signal N_frac in synchronization with the reference signal REF.

Furthermore, the circuit configuration including the second ΔΣ modulator 14, the second subtractor 15, and the second integrator 16 corresponds to the circuit configuration including the first ΔΣ modulator 9, the first subtractor 11, and the first integrator 12.

Thus, the second phase detection signal E2 calculated by the second integrator 16 indicates the phase of the output signal OUT of a case where it is assumed that the first ΔΣ modulator 9 controls the division ratio of the output signal OUT of the variable frequency divider 7 in synchronization with the reference signal REF.

The negative feedback signal generating circuit 18 generates the negative feedback signal CAL from the difference (E2−E1) between the first phase detection signal E1 output from the first integrator 12 and the second phase detection signal E2 output from the second integrator 16.

That is, the negative feedback signal generating circuit 18 compares the first phase detection signal E1 and the second phase detection signal E2 with each other, generates the negative feedback signal CAL to achieve the relation E1=E2, and outputs the negative feedback signal CAL to the adder 19.

Figure 3:
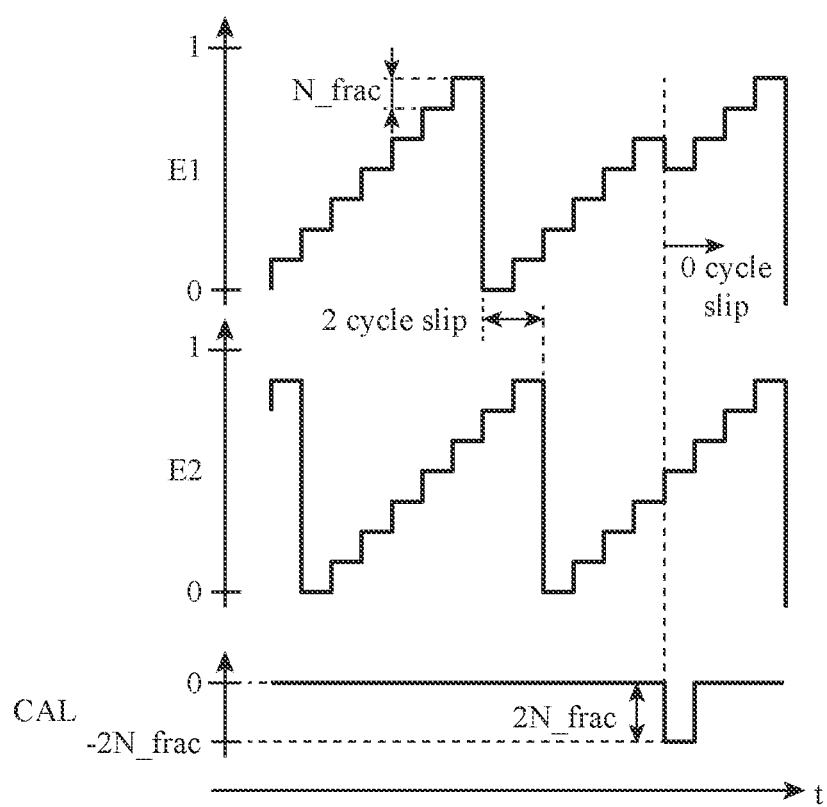
FIG. 3 is an explanatory diagram illustrating an example of generation of a negative feedback signal CAL by a negative feedback signal generating circuit 18.

FIG. 3 is an explanatory diagram illustrating an example of generation of the negative feedback signal CAL by the negative feedback signal generating circuit 18.

In FIG. 3, it is assumed that each of the first ΔΣ modulator 9 and the second ΔΣ modulator 14 is a first-order ΔΣ modulator, and the first phase detection signal E1 is delayed by two clocks from the second phase detection signal E2.

In the example of FIG. 3, the negative feedback signal generating circuit 18 sets the negative feedback signal CAL to −2N_frac only in a cycle section of one clock, and sets the negative feedback signal CAL to 0 in all other cycle sections.

The negative feedback signal generating circuit 18 sets the negative feedback signal CAL to −2N_frac, whereby the addition signal output from the adder 19 to the first ΔΣ modulator 9 is CAL+N_frac=−N_frac, and the first phase detection signal E1 changes. The first phase detection signal E1 changes, whereby the relation E1=E2 is achieved.

Thus, since E1=E2 is achieved in the phase-locked loop circuit illustrated in FIG. 1, in a case where, for example, a plurality of the phase-locked loop circuits each having the configuration illustrated in FIG. 1 is mounted on a communication apparatus, it is possible to align phases of the output signals OUT of the plurality of phase-locked loop circuits.

In the first embodiment described above, the phase-locked loop circuit includes: a division ratio control circuit 8 controlling a division ratio of a divided signal to be output by a variable frequency divider 7 on a basis of an addition signal in which a negative feedback signal is added to a division ratio setting signal indicating a division ratio, in synchronization with the divided signal output from the variable frequency divider 7; a first phase detection circuit 10 calculating a first phase detection signal indicating a phase of an output signal of a signal output circuit 3; a second phase detection circuit 13 calculating a second phase detection signal indicating a phase of the output signal of the variable frequency divider in a case where it is assumed that the division ratio control circuit 8 controls the division ratio of the divided signal to be output by the variable frequency divider 7 in synchronization with the a signal; and a shift circuit 17 generating the negative feedback signal from a difference between the first phase detection signal and the second phase detection signal, and outputting the addition signal of the negative feedback signal and the division ratio setting signal to the division ratio control circuit 8. Thus, the phase-locked loop circuit of the first embodiment can output an output signal having the same phase as a phase of an output signal of another phase-locked loop circuit having the same configuration.

Second Embodiment

In a second embodiment, a phase-locked loop circuit will be described in which a first first-order ΔΣ modulator 23 is included in a division ratio control circuit 21, and the first first-order ΔΣ modulator 23 is included in a first phase detection circuit 22.

Figure 4:
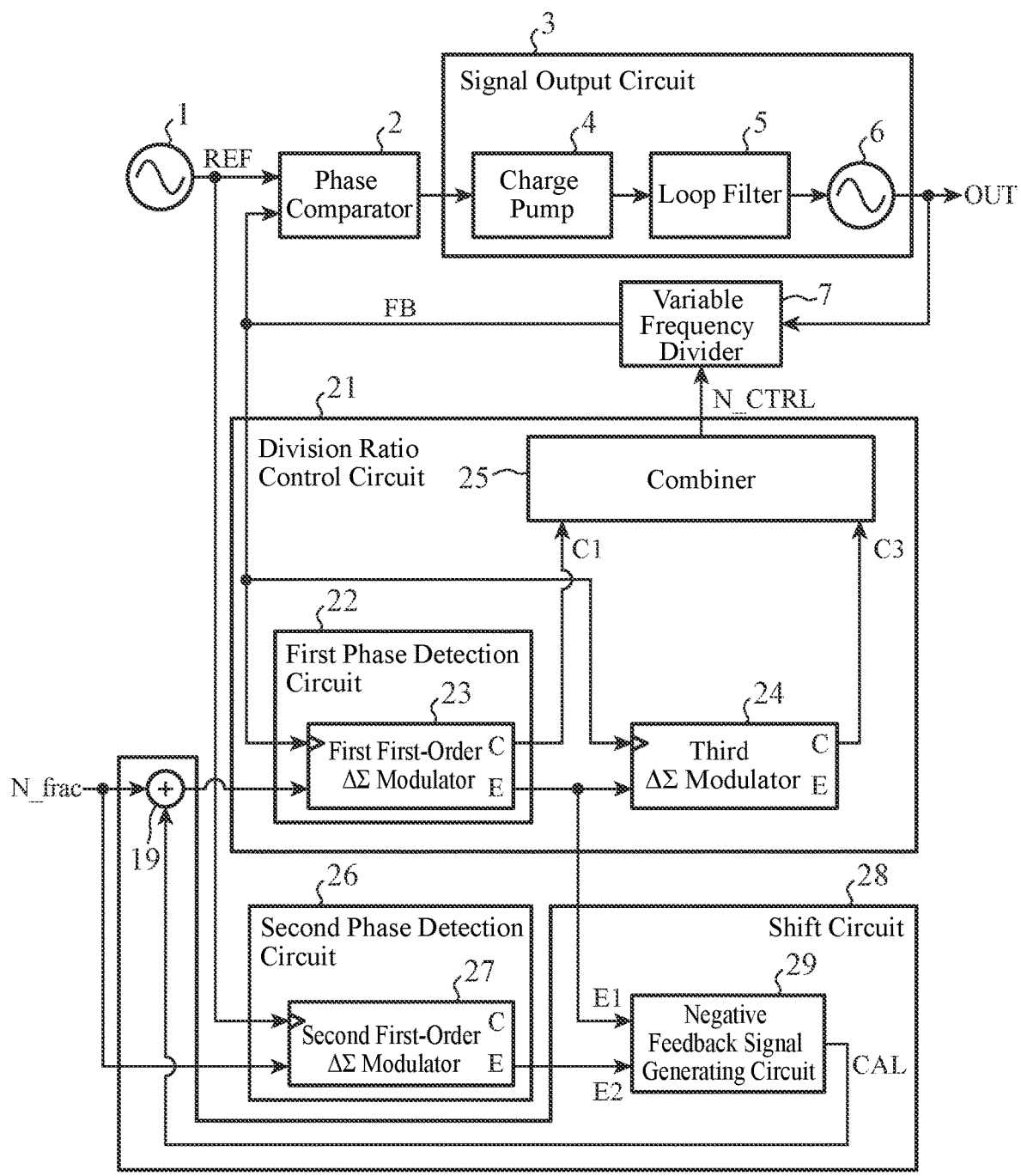
FIG. 4 is a configuration diagram illustrating a phase-locked loop circuit according to a second embodiment.

FIG. 4 is a configuration diagram illustrating the phase-locked loop circuit according to the second embodiment. In FIG. 4, since the same reference numerals as those in FIG. 1 denote the same or corresponding portions, the description thereof will be omitted.

The division ratio control circuit 21 is a MASH type ΔΣ modulator including the first first-order ΔΣ modulator 23, a third ΔΣ modulator 24, and a combiner 25.

Similarly to the division ratio control circuit illustrated in FIG. 1, the division ratio control circuit 21 controls the division ratio of the output signal OUT of the variable frequency divider 7 in synchronization with the divided signal FB output from the variable frequency divider 7 on the basis of the addition signal output from the adder 19.

The first phase detection circuit 22 includes the first first-order ΔΣ modulator 23.

Similarly to the first phase detection circuit 10 illustrated in FIG. 1, the first phase detection circuit 22 calculates the first phase detection signal E1 indicating the phase of the output signal OUT of the VCO 6.

The first first-order ΔΣ modulator 23 performs the ΔΣ modulaton of the addition signal output from the adder 19 in synchronization with the divided signal FB output from the variable frequency divider 7.

The first first-order ΔΣ modulator 23 outputs an error output E of the ΔΣ modulation as the first phase detection signal E1 to each of the third ΔΣ modulator 24 and a negative feedback signal generating circuit 29, and outputs a carry output C of the ΔΣ modulaton to the combiner 25.

The third ΔΣ modulator 24 performs ΔΣ modulaton on the error output E of the first first-order ΔΣ modulator 23 in synchronization with the divided signal FB output from the variable frequency divider 7, and outputs a carry output C of the ΔΣ modulation to the combiner 25.

The combiner 25 is implemented by a delay device, an adder-subtractor, and the like.

The combiner 25 controls the division ratio of the output signal OUT of the variable frequency divider 7 on the basis of the carry output C of the ΔΣ modulaton of the first first-order ΔΣ modulator 23 and the carry output C of the ΔΣ modulaton of the third ΔΣ modulator 24.

That is, the combiner 25 obtains the division ratio control signal N_CTRL by combining the carry output C of the ΔΣ modulaton of the first first-order ΔΣ modulator 23 and the carry output C of the ΔΣ modulaton of the third ΔΣ modulator 24 together, and outputs the division ratio control signal N_CTRL to the variable frequency divider 7.

A second phase detection circuit 26 includes a second first-order ΔΣ modulator 27.

The second phase detection circuit 26 outputs the second phase detection signal E2 indicating the phase of the output signal OUT of a case where it is assumed that the division ratio control circuit 21 controls the division ratio of the output signal OUT of the variable frequency divider 7 in synchronization with the reference signal REF.

The second first-order ΔΣ modulator 27 performs the ΔΣ modulaton of the division ratio setting signal N_frac in synchronization with the reference signal REF.

The second first-order ΔΣ modulator 27 outputs an error output E of the ΔΣ modulation as the second phase detection signal E2 to the negative feedback signal generating circuit 29.

A shift circuit 28 includes the negative feedback signal generating circuit 29 and the adder 19.

Similarly to the shift circuit 17 illustrated in FIG. 1, the shift circuit 28 generates the negative feedback signal CAL and outputs the addition signal of the negative feedback signal CAL and the division ratio setting signal N_frac to the first first-order ΔΣ modulator 23.

The negative feedback signal generating circuit 29 receives the error output E of the ΔΣ modulaton of the first first-order ΔΣ modulator 23 as the first phase detection signal E1, and receives the error output E of the ΔΣ modulaton of the second first-order ΔΣ modulator 27 as the second phase detection signal E2.

The negative feedback signal generating circuit 29 generates the negative feedback signal CAL from a difference between the error output E of the ΔΣ modulaton of the first first-order ΔΣ modulator 23 and the error output E of the ΔΣ modulaton of the second first-order ΔΣ modulator 27, and outputs the negative feedback signal CAL to the adder 19.

Figure 5:
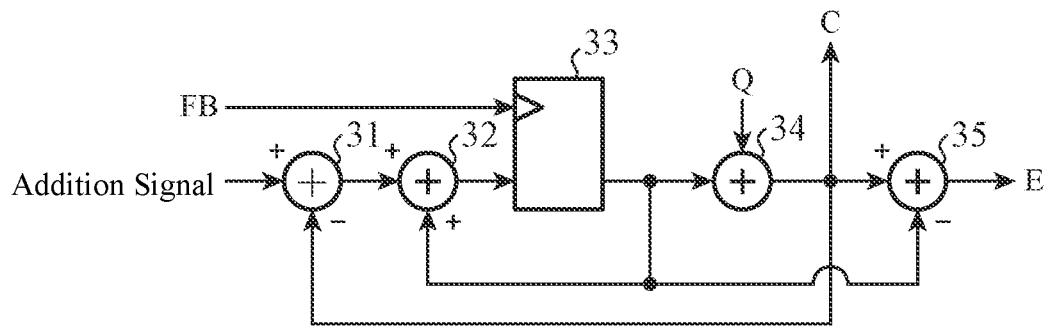
FIG. 5 is a configuration diagram illustrating a first first-order ΔΣ modulator 23 of the phase-locked loop circuit according to the second embodiment.

FIG. 5 is a configuration diagram illustrating the first first-order ΔΣ modulator 23 of the phase-locked loop circuit according to the second embodiment.

In FIG. 5, a subtractor 31 subtracts an addition signal output from an adder 34 from the addition signal output from the adder 19, and outputs a subtraction signal indicating a result of the subtraction to an adder 32.

The adder 32 outputs an addition signal of the subtraction signal output from the subtractor 31 and an output signal of a flip-flop 33 to the flip-flop 33.

The flip-flop 33 latches the addition signal output from the adder 32 in synchronization with the divided signal FB output from the variable frequency divider 7, and outputs an output signal that is a logical result to each of the adder 32, the adder 34, and a subtractor 35.

The adder 34 outputs an addition signal of the output signal of the flip-flop 33 and a quantization error Q to each of the subtractor 31, the subtractor 35, and the outside.

The subtractor 35 subtracts the output signal of the flip-flop 33 from the addition signal output from the adder 34, and outputs a subtraction signal indicating a result of the subtraction as the error output E to the outside.

Note that, if the division ratio setting signal N_frac is input instead of the addition signal and the reference signal REF is input instead of the divided signal FB, the configuration diagram of FIG. 5 corresponds to a configuration diagram of the second first-order ΔΣ modulator 27.

Next, the operation of the phase-locked loop circuit illustrated in FIG. 4 will be described.

Since components other than the division ratio control circuit 21, the second phase detection circuit 26, and the shift circuit 28 are similar to those of the phase-locked loop circuit illustrated in FIG. 1, here, the operation of the division ratio control circuit 21, the second phase detection circuit 26, and the shift circuit 28 will be described.

The first first-order ΔΣ modulator 23 performs the ΔΣ modulaton of the addition signal output from the adder 19 in synchronization with the divided signal FB output from the variable frequency divider 7.

As illustrated in FIG. 4, the first first-order ΔΣ modulator 23 outputs the error output E of the ΔΣ modulaton as the first phase detection signal E1 to each of the third ΔΣ modulator 24 and the negative feedback signal generating circuit 29, and outputs the carry output C (=C1) of the ΔΣ modulaton to the combiner 25.

The third ΔΣ modulator 24 performs the ΔΣ modulaton of the error output E (=E1) of the first first-order ΔΣ modulator 23 in synchronization with the divided signal FB output from the variable frequency divider 7.

The third ΔΣ modulator 24 outputs the carry output C (=C3) of the ΔΣ modulation to the combiner 25.

The second first-order ΔΣ modulator 27 performs the ΔΣ modulaton of the division ratio setting signal N_frac in synchronization with the reference signal REF.

Figure 6:
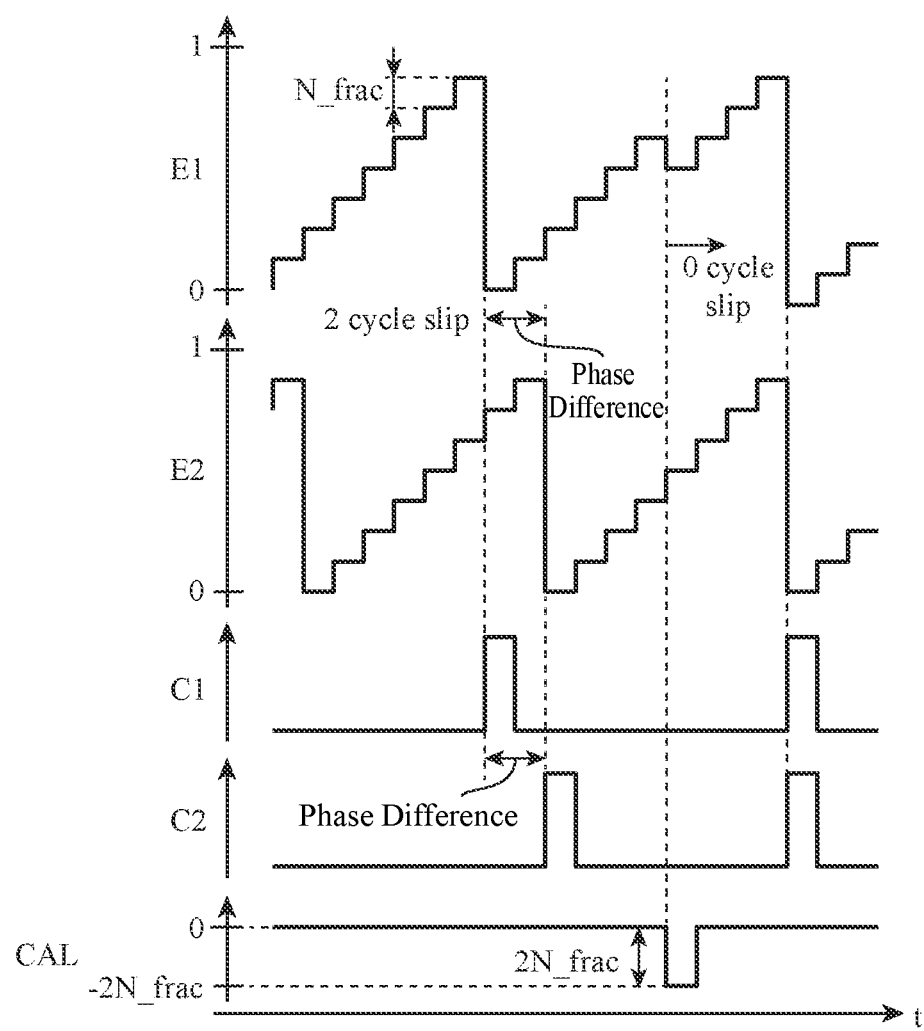
FIG. 6 is an explanatory diagram illustrating an example of an error output E (=E1) and a carry output C (=C1) of ΔΣ modulaton of the first first-order ΔΣ modulator 23, and an error output E (=E2) and a carry output C (=C2) of ΔΣ modulaton of a second first-order ΔΣ modulator 27.

As illustrated in FIG. 6, the second first-order ΔΣ modulator 27 outputs the error output E of the ΔΣ modulaton as the second phase detection signal E2 to the negative feedback signal generating circuit 29.

FIG. 6 is an explanatory diagram illustrating an example of the error output E (=E1) and the carry output C (=C1) of the ΔΣ modulation of the first first-order ΔΣ modulator 23, and the error output E (=E2) and the carry output C (=C2) of the ΔΣ modulation of the second first-order ΔΣ modulator 27.

The combiner 25 controls the division ratio of the output signal of the variable frequency divider 7 on the basis of the carry output C (=C1) of the ΔΣ modulaton of the first first-order ΔΣ modulator 23 and the carry output C (=C3) of the ΔΣ modulaton of the third ΔΣ modulator 24.

That is, the combiner 25 obtains the division ratio control signal N_CTRL by combining the carry output C (=C1) of the ΔΣ modulaton of the first first-order ΔΣ modulator 23 and the carry output C (=C3) of the third ΔΣ modulator 24.

The combiner 25 multiplies each of the carry output C (=C1) and the carry output C (=C3) by a transfer function so that the division ratio control signal N_CTRL has desired noise shaping characteristics, and then combines the carry output C1 and carry output C3 together.

The combiner 25 outputs the division ratio control signal N_CTRL to the variable frequency divider 7.

The negative feedback signal generating circuit 29 receives the error output E of the ΔΣ modulaton of the first first-order ΔΣ modulator 23 as the first phase detection signal E1, and receives the error output E of the ΔΣ modulaton of the second first-order ΔΣ modulator 27 as the second phase detection signal E2.

The negative feedback signal generating circuit 29 generates the negative feedback signal CAL from a difference between the error output E of the ΔΣ modulaton of the first first-order ΔΣ modulator 23 and the error output E of the ΔΣ modulaton of the second first-order ΔΣ modulator 27, and outputs the negative feedback signal CAL to the adder 19.

The adder 19 adds the division ratio setting signal N_frac and the negative feedback signal CAL output from the negative feedback signal generating circuit 29 together.

The adder 19 outputs the addition signal of the division ratio setting signal N_frac and the negative feedback signal CAL to the first first-order ΔΣ modulator 23.

The operation principle of the phase-locked loop circuit illustrated in FIG. 4 is similar to the operation principle of the phase-locked loop circuit illustrated in FIG. 1, and negative feedback is applied so that the first phase detection signal E1 becomes equal to the second phase detection signal E2.

Thus, the phase-locked loop circuit illustrated in FIG. 4 can output an output signal having the same phase as a phase of an output signal of another phase-locked loop circuit having the same configuration.

Furthermore, in the phase-locked loop circuit illustrated in FIG. 4, the first subtractor 11, the first integrator 12, the second subtractor 15, and the second integrator 16 are not required, and the circuit scale can be reduced more than that of the phase-locked loop circuit illustrated in FIG. 1.

Third Embodiment

In a third embodiment, a phase-locked loop circuit in which a shift circuit 41 includes a second phase comparator 42, a filter 43, and the adder 19 will be described.

Figure 7:
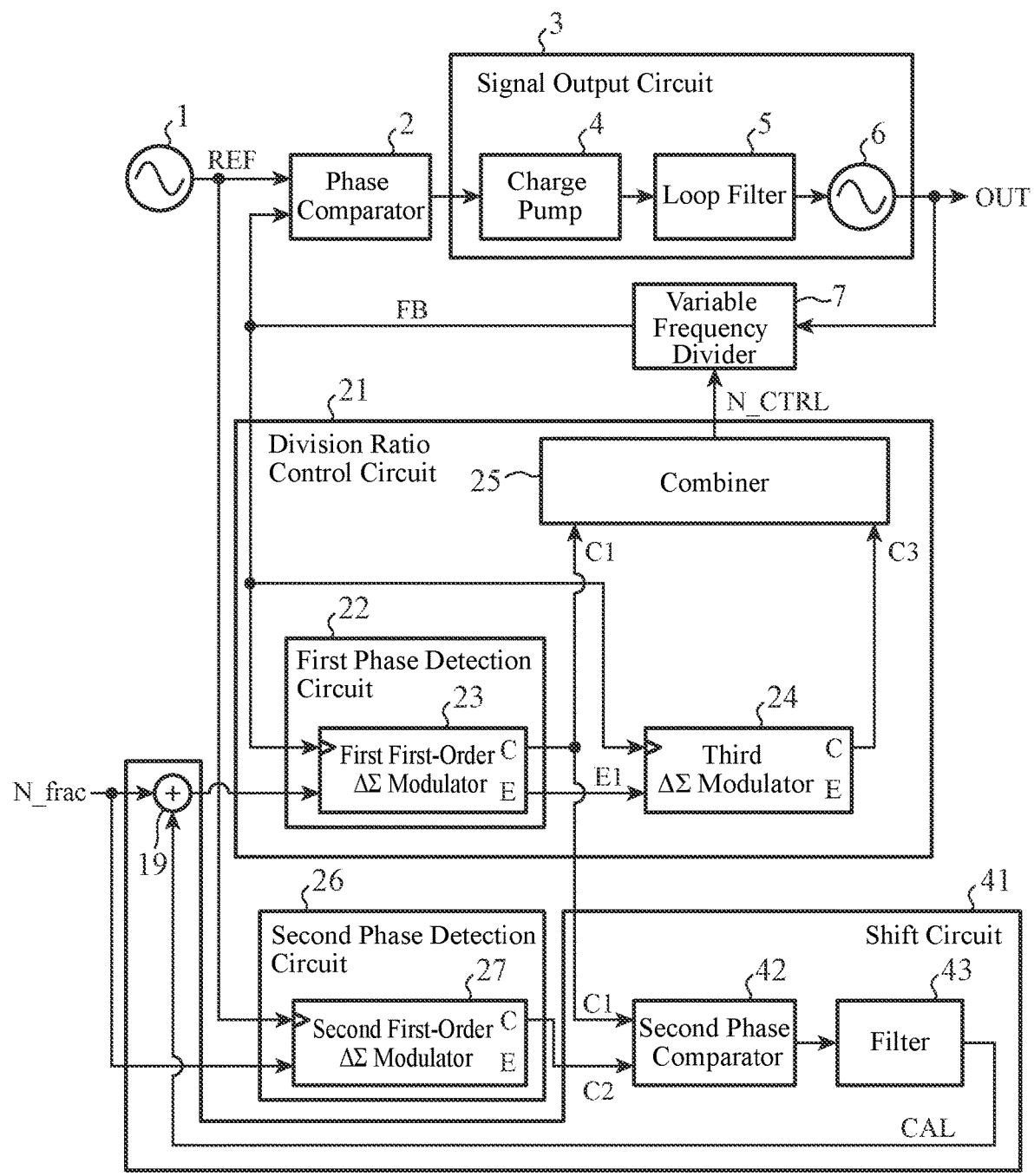
FIG. 7 is a configuration diagram illustrating a phase-locked loop circuit according to a third embodiment.

FIG. 7 is a configuration diagram illustrating the phase-locked loop circuit according to the third embodiment. In FIG. 7, since the same reference numerals as those in FIGS. 1 and 4 denote the same or corresponding portions, the description thereof will be omitted.

Similarly to the shift circuit 28 illustrated in FIG. 4, the shift circuit 41 generates the negative feedback signal CAL and outputs the addition signal of the negative feedback signal CAL and the division ratio setting signal N_frac to the first first-order ΔΣ modulator 23.

The second phase comparator 42 detects a phase difference between the carry output C of the ΔΣ modulaton of the first first-order ΔΣ modulator 23 and the carry output C of the ΔΣ modulaton of the second first-order ΔΣ modulator 27, and outputs the phase difference to the filter 43.

The filter 43 generates the negative feedback signal CAL from the phase difference output from the second phase comparator 42, and outputs the negative feedback signal CAL to the adder 19.

Next, the operation of the phase-locked loop circuit illustrated in FIG. 7 will be described.

Since components other than the second phase comparator 42 and the filter 43 are similar to those of the phase-locked loop circuit illustrated in FIG. 4, here, the operation of the second phase comparator 42 and the filter 43 will be described.

In the phase-locked loop circuit illustrated in FIG. 4, the negative feedback signal generating circuit 29 receives the error output E (=E1) of the ΔΣ modulaton of the first first-order ΔΣ modulator 23 and the error output E (=E2) of the ΔΣ modulaton of the second first-order ΔΣ modulator 27.

In the phase-locked loop circuit illustrated in FIG. 7, the second phase comparator 42 receives the carry output C (=C1) of the ΔΣ modulaton of the first first-order ΔΣ modulator 23 and the carry output C (=C2) of the ΔΣ modulaton of the second first-order ΔΣ modulator 27.

Input signals of the second phase comparator 42 are different from those of the negative feedback signal generating circuit 29.

As illustrated in FIG. 6, the carry output C (=C1) of the ΔΣ modulaton of the first first-order ΔΣ modulator 23 corresponds to a timing at which the error output E (=E1) of the ΔΣ modulaton of the first first-order ΔΣ modulator 23 overflows.

As illustrated in FIG. 6, the carry output C (=C2) of the ΔΣ modulaton of the second first-order ΔΣ modulator 27 corresponds to a timing at which the error output E (=E2) of the ΔΣ modulaton of the second first-order ΔΣ modulator 27 overflows.

The second phase comparator 42 detects the phase difference between the carry output C (=C1) of the ΔΣ modulaton of the first first-order ΔΣ modulator 23 and the carry output C (=C2) of the ΔΣ modulaton of the second first-order ΔΣ modulator 27.

The phase difference between the carry outputs C corresponds to the difference between the first phase detection signal E1 and the second phase detection signal E2.

Upon receiving the phase difference from the second phase comparator 42, the filter 43 generates the negative feedback signal CAL that makes the phase difference zero, and outputs the negative feedback signal CAL to the adder 19.

The adder 19 adds the division ratio setting signal N_frac and the negative feedback signal CAL output from the filter 43 together.

The adder 19 outputs the addition signal of the division ratio setting signal N_frac and the negative feedback signal CAL to the first first-order ΔΣ modulator 23.

The operation principle of the phase-locked loop circuit illustrated in FIG. 7 is similar to the operation principle of the phase-locked loop circuits illustrated in FIGS. 1 and 4. Negative feedback is applied so that the carry output C (=C1) of the ΔΣ modulation of the first first-order ΔΣ modulator 23 becomes equal to the carry output C (=C2) of the ΔΣ modulaton of the second first-order ΔΣ modulator 27.

Thus, the phase-locked loop circuit illustrated in FIG. 7 can output an output signal having the same phase as a phase of an output signal of another phase-locked loop circuit having the same configuration.

There are methods of the negative feedback, such as a method discontinuously performed as illustrated in FIG. 6, and a method continuously performed by being blunted by a time constant.

When the negative feedback is performed within one clock cycle, the filter 43 generates a pulsed signal as the negative feedback signal CAL, as illustrated in FIG. 6.

When the negative feedback is continuously performed, the filter 43 operates as a low pass filter and applies negative feedback slowly depending on a time constant of the low-pass filter.

Fourth Embodiment

In a fourth embodiment, a phase-locked loop circuit will be described in which the division ratio control circuit 8 is the first ΔΣ modulator 9, the first phase detection circuit 22 is the first first-order ΔΣ modulator 23, and the second phase detection circuit 26 is the second first-order ΔΣ modulator 27, and the shift circuit 28 includes the negative feedback signal generating circuit 29.

Figure 8:
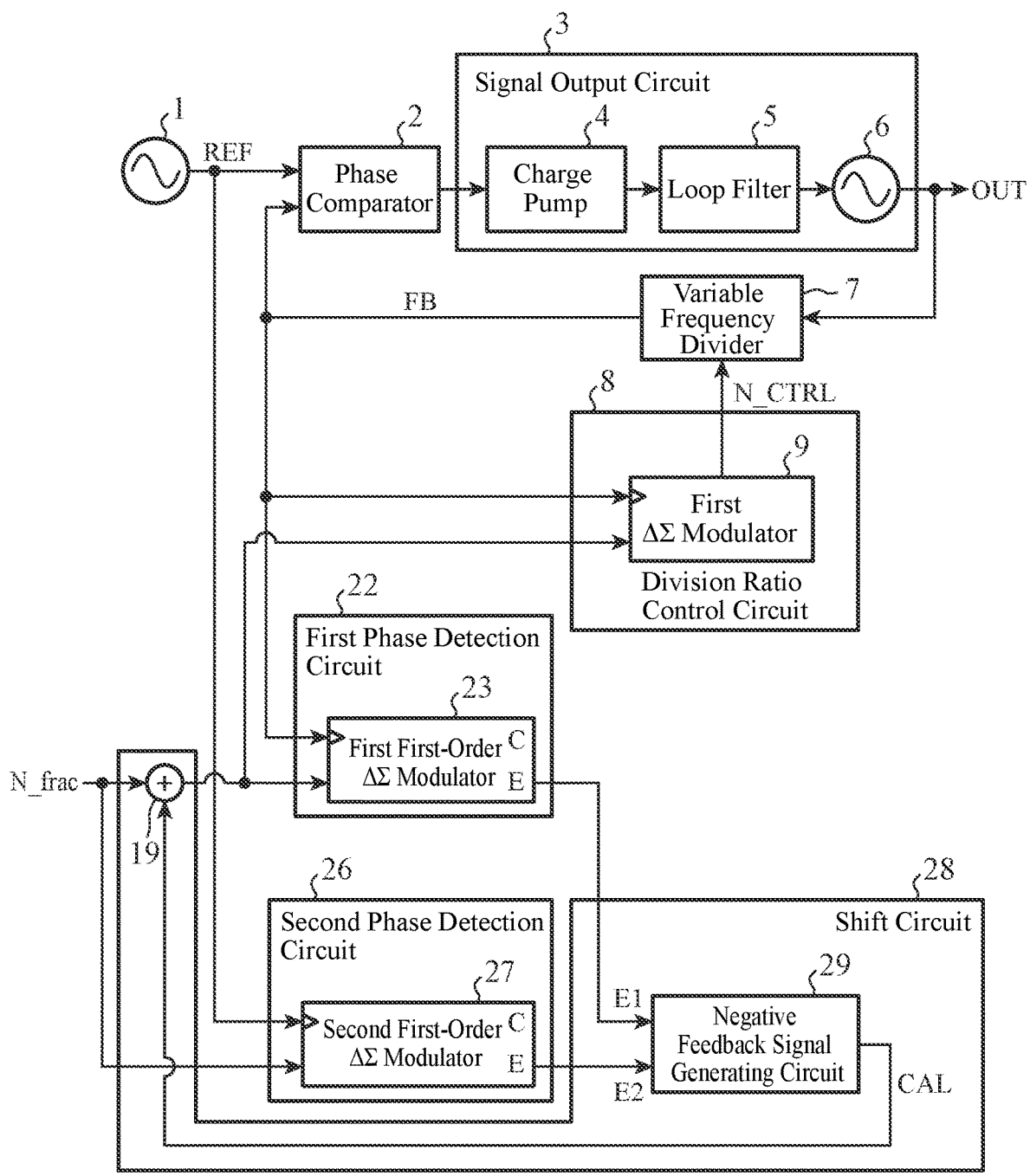
FIG. 8 is a configuration diagram illustrating a phase-locked loop circuit according to a fourth embodiment.

FIG. 8 is a configuration diagram illustrating the phase-locked loop circuit according to the fourth embodiment. In FIG. 8, the same reference numerals as those in FIGS. 1 and 4 denote the same or corresponding portions.

The operation principle of the phase-locked loop circuit illustrated in FIG. 8 is similar to the operation principle of the phase-locked loop circuits illustrated in FIGS. 1 and 4, and negative feedback is applied so that the first phase detection signal E1 becomes equal to the second phase detection signal E2.

Thus, the phase-locked loop circuit illustrated in FIG. 8 can output an output signal having the same phase as a phase of an output signal of another phase-locked loop circuit having the same configuration.

Furthermore, in the phase-locked loop circuit illustrated in FIG. 8, the first subtractor 11, the first integrator 12, the second subtractor 15, and the second integrator 16 are not required, and the circuit scale can be reduced more than that of the phase-locked loop circuit illustrated in FIG. 1.

Fifth Embodiment

In a fifth embodiment, a phase-locked loop circuit will be described in which the division ratio control circuit 8 is the first ΔΣ modulator 9, the first phase detection circuit 22 is the first first-order ΔΣ modulator 23, and the second phase detection circuit 26 is the second first-order ΔΣ modulator 27, and the shift circuit 28 includes the second phase comparator 42 and the filter 43.

Figure 9:
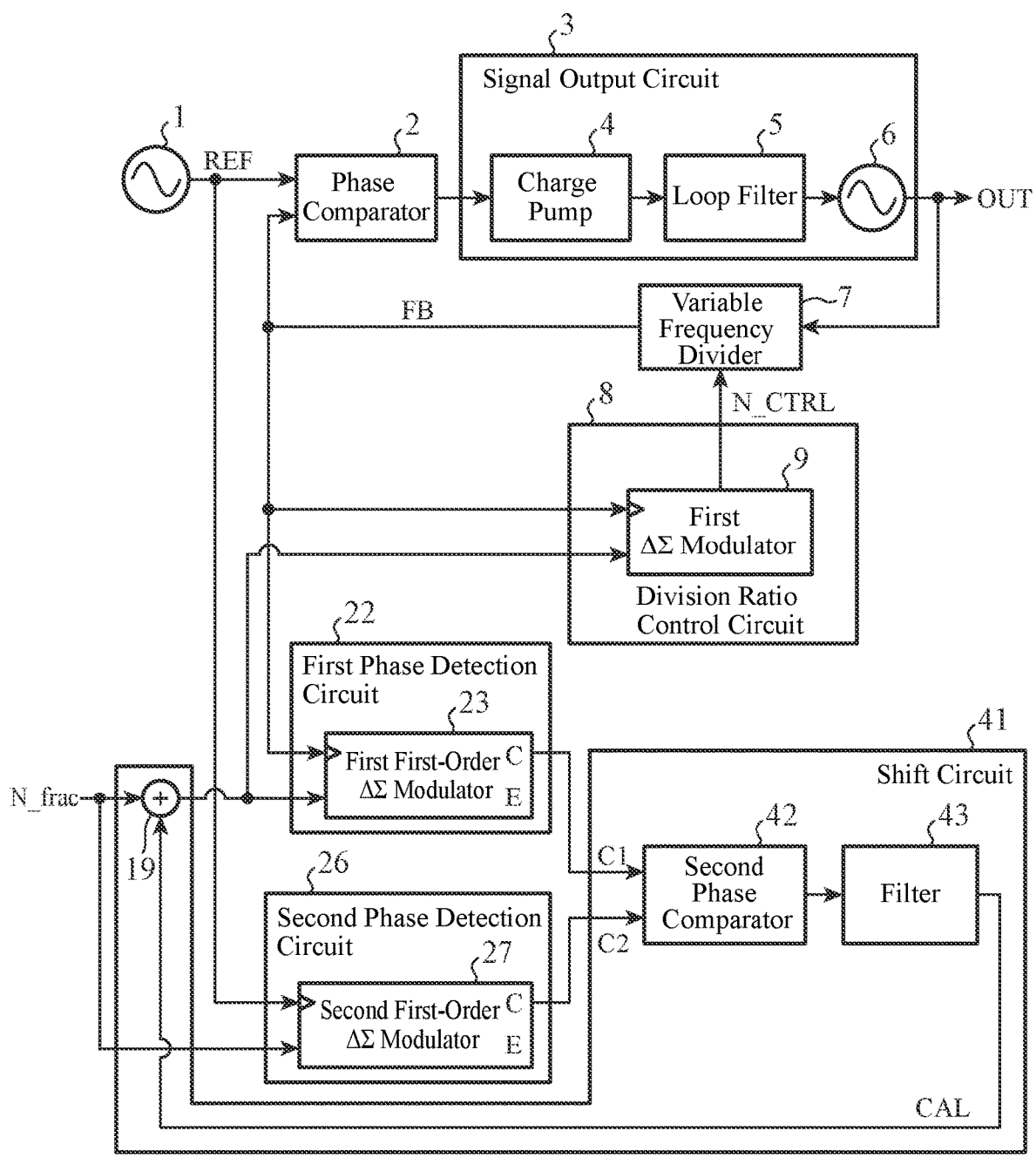
FIG. 9 is a configuration diagram illustrating a phase-locked loop circuit according to a fifth embodiment.

FIG. 9 is a configuration diagram illustrating the phase-locked loop circuit according to the fifth embodiment. In FIG. 9, the same reference numerals as those in FIGS. 1 and 7 denote the same or corresponding portions.

The operation principle of the phase-locked loop circuit illustrated in FIG. 9 is similar to the operation principle of the phase-locked loop circuit illustrated in FIG. 7. Negative feedback is applied so that the carry output C (=C1) of the ΔΣ modulaton of the first first-order ΔΣ modulator 23 becomes equal to the carry output C (=C2) of the ΔΣ modulaton of the second first-order ΔΣ modulator 27.

Thus, the phase-locked loop circuit illustrated in FIG. 9 can output an output signal having the same phase as a phase of an output signal of another phase-locked loop circuit having the same configuration.

Furthermore, in the phase-locked loop circuit illustrated in FIG. 9, the first subtractor 11, the first integrator 12, the second subtractor 15, and the second integrator 16 are not required, and the circuit scale can be reduced more than that of the phase-locked loop circuit illustrated in FIG. 1.

Sixth Embodiment

In a sixth embodiment, a phase-locked loop circuit in which a first phase detection circuit 51 is a first frequency divider 52, and a second phase detection circuit 53 is a second frequency divider 54 will be described.

Figure 10:
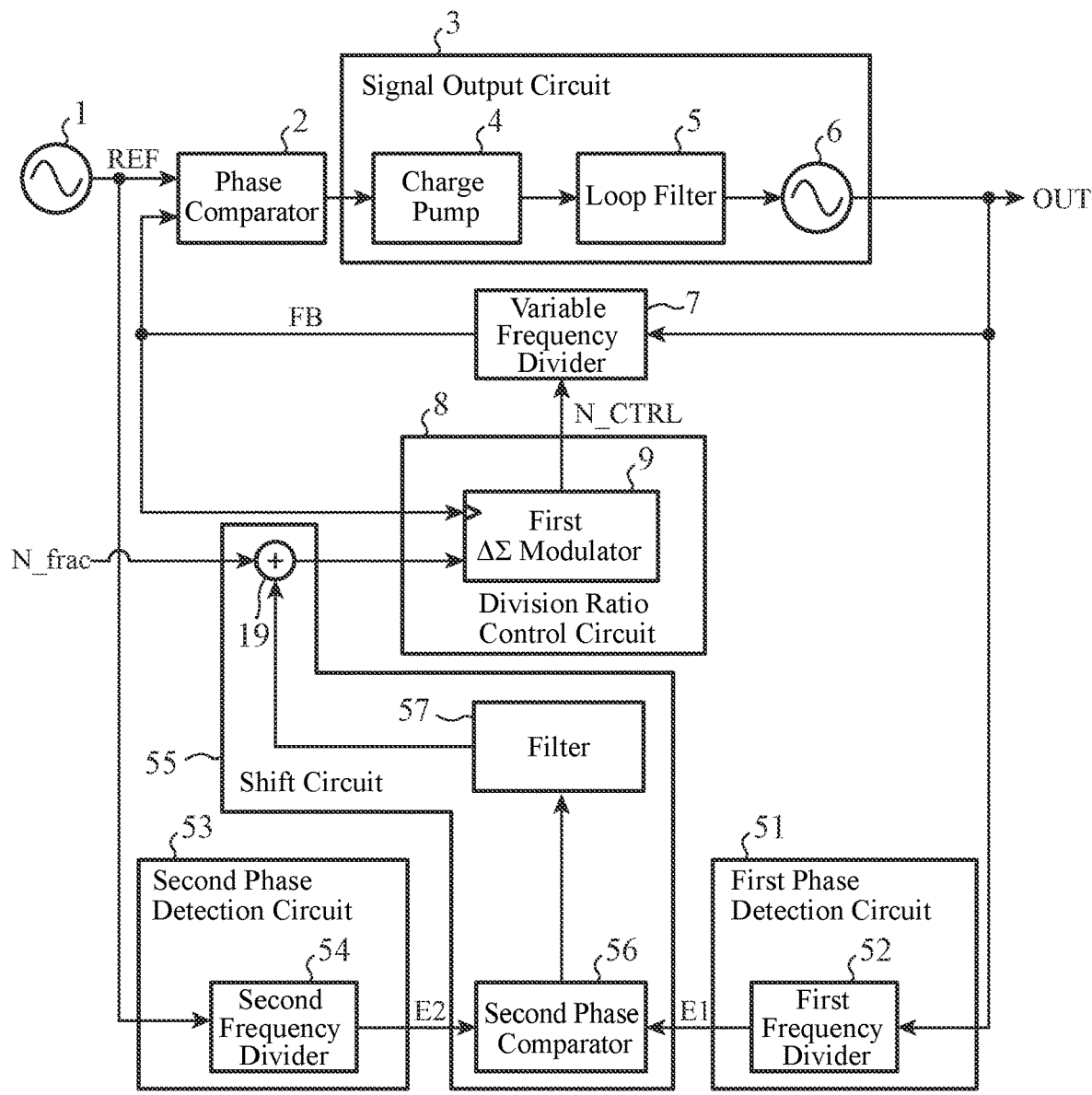
FIG. 10 is a configuration diagram illustrating a phase-locked loop circuit according to a sixth embodiment.

FIG. 10 is a configuration diagram illustrating the phase-locked loop circuit according to the sixth embodiment. In FIG. 10, since the same reference numerals as those in FIG. 1 denote the same or corresponding portions, the description thereof will be omitted.

The first phase detection circuit 51 includes the first frequency divider 52.

Similarly to the first phase detection circuit 10 illustrated in FIG. 1, the first phase detection circuit 51 calculates the first phase detection signal E1 indicating the phase of the output signal OUT of the VCO 6.

The first frequency divider 52 divides the output signal OUT of the VCO 6 by M (M is an integer), and outputs the divided signal of the output signal OUT as the first phase detection signal E1 to a second phase comparator 56.

The second phase detection circuit 53 includes the second frequency divider 54.

Similarly to the second phase detection circuit 13 illustrated in FIG. 1, the second phase detection circuit 53 calculates the second phase detection signal E2 indicating the phase of the output signal OUT of a case where it is assumed that the division ratio control circuit 8 controls the division ratio of the output signal OUT of the variable frequency divider 7 in synchronization with the reference signal REF.

The second frequency divider 54 divides the reference signal REF by L (L is an integer), and outputs the divided signal of the reference signal REF as the second phase detection signal E2 to the second phase comparator 56.

A shift circuit 55 includes the second phase comparator 56, a filter 57, and the adder 19.

Similarly to the shift circuit 17 illustrated in FIG. 1, the shift circuit 55 generates the negative feedback signal CAL and calculates the addition signal of the negative feedback signal CAL and the division ratio setting signal N_frac.

The second phase comparator 56 detects a phase difference between the divided signal output from the first frequency divider 52 and the divided signal output from the second frequency divider 54, and outputs the phase difference to the filter 57.

The filter 57 generates the negative feedback signal CAL from the phase difference output from the second phase comparator 56 and outputs the negative feedback signal CAL to the adder 19.

Next, the operation of the phase-locked loop circuit illustrated in FIG. 10 will be described.

Since components other than the first phase detection circuit 51, the second phase detection circuit 53, and the shift circuit 55 are similar to those of the phase-locked loop circuit illustrated in FIG. 1, here, the operation of the first phase detection circuit 51, the second phase detection circuit 53, and the shift circuit 55 will be described.

First, the division ratio M of the output signal OUT of the first frequency divider 52 and the division ratio L of the reference signal REF of the second frequency divider 54 are selected so that M/L matches an average division ratio (=multiplication ratio of the phase-locked loop circuit) of the output signal OUT of the variable frequency divider 7.

Here, for convenience of description, the description will be made assuming that the division ratio M of the output signal OUT of the first frequency divider 52 is 9, the division ratio L of the reference signal REF of the second frequency divider 54 is 4, and the average division ratio of the output signal OUT of the variable frequency divider 7 is M/L=2.25.

Figure 11:
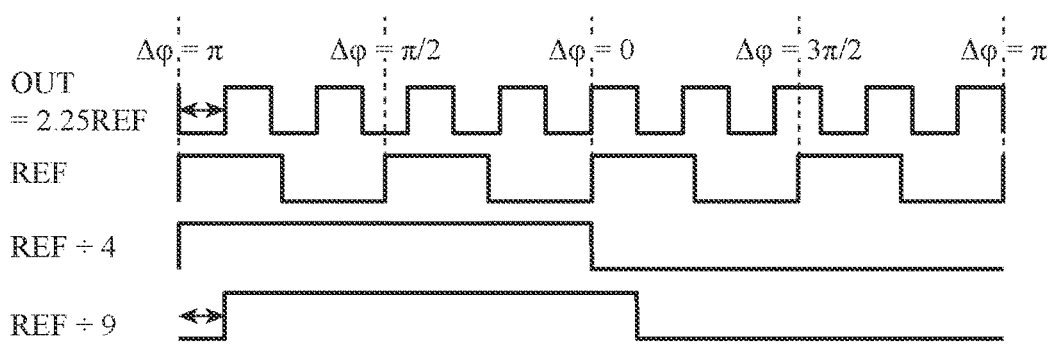
FIG. 11 is an explanatory diagram illustrating waveforms of a reference signal REF, the output signal OUT, a divided signal (REF÷9) output from a first frequency divider 52, and a divided signal (REF÷4) output from a second frequency divider 54.

FIG. 11 is an explanatory diagram illustrating waveforms of the reference signal REF, the output signal OUT, the divided signal (REF÷9) output from the first frequency divider 52, and the divided signal (REF÷4) output from the second frequency divider 54.

The first frequency divider 52 and the second frequency divider 54 each are a frequency divider whose division ratio is fixed.

In the frequency divider whose division ratio is fixed, unlike the variable frequency divider 7, only one state exists as a phase state.

Thus, a phase of the divided signal output from the first frequency divider 52 always corresponds to the phase of the output signal OUT, and a phase of the divided signal output from the second frequency divider 54 always corresponds to a phase of the reference signal REF.

The second phase comparator 56 detects the phase difference between the divided signal output from the first frequency divider 52 and the divided signal output from the second frequency divider 54, and outputs the phase difference to the filter 57.

Upon receiving the phase difference from the second phase comparator 56, the filter 57 generates the negative feedback signal CAL that makes the phase difference zero, and outputs the negative feedback signal CAL to the adder 19.

The adder 19 adds the division ratio setting signal N_frac and the negative feedback signal CAL output from the filter 57 together.

The adder 19 outputs the addition signal of the division ratio setting signal N_frac and the negative feedback signal CAL to the first ΔΣ modulator 9.

The operation principle of the phase-locked loop circuit illustrated in FIG. 10 is similar to the operation principle of the phase-locked loop circuit illustrated in FIG. 1, and negative feedback is applied so that the first phase detection signal E1 becomes equal to the second phase detection signal E2.

Thus, the phase-locked loop circuit illustrated in FIG. 10 can output an output signal having the same phase as a phase of an output signal of another phase-locked loop circuit having the same configuration.

Furthermore, in the phase-locked loop circuit illustrated in FIG. 10, the first subtractor 11, the first integrator 12, the second subtractor 15, and the second integrator 16 are not required, and the circuit scale can be reduced more than that of the phase-locked loop circuit illustrated in FIG. 1.

Seventh Embodiment

In a seventh embodiment, a phase-locked loop circuit in which a first phase detection circuit 58 includes the first frequency divider 52 and a first counter 59, and a second phase detection circuit 60 includes the second frequency divider 54 and a second counter 61 will be described.

Figure 12:
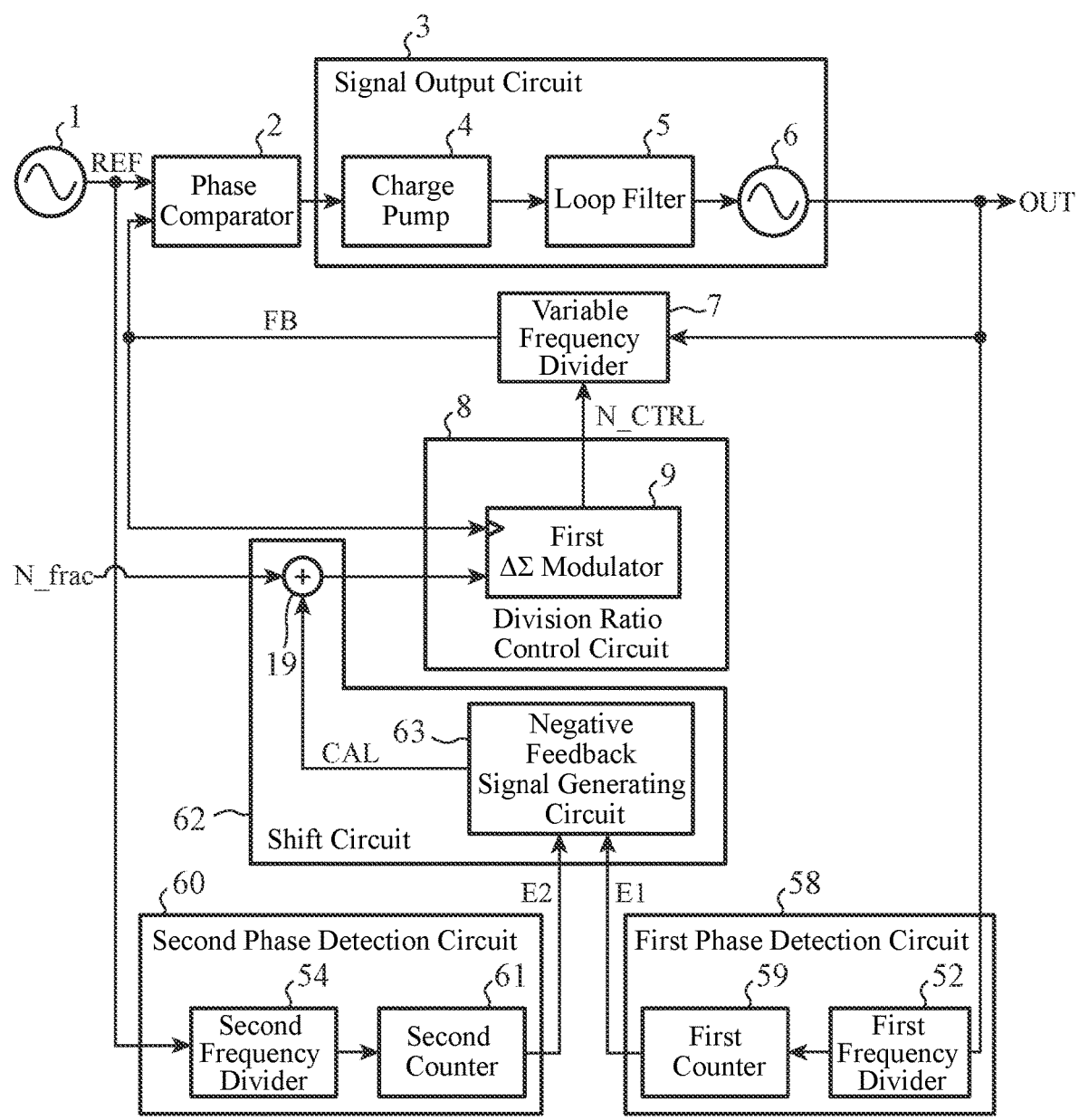
FIG. 12 is a configuration diagram illustrating a phase-locked loop circuit according to a seventh embodiment.

FIG. 12 is a configuration diagram illustrating the phase-locked loop circuit according to the seventh embodiment. In FIG. 12, since the same reference numerals as those in FIGS. 1 and 10 denote the same or corresponding portions, the description thereof will be omitted.

The first phase detection circuit 58 includes the first frequency divider 52 and the first counter 59.

Similarly to the first phase detection circuit 10 illustrated in FIG. 1, the first phase detection circuit 58 calculates the first phase detection signal E1 indicating the phase of the output signal OUT of the VCO 6.

The first counter 59 counts the number of pulses of the divided signal output from the first frequency divider 52, and outputs the number of pulses of the divided signal as the first phase detection signal E1 to the negative feedback signal generating circuit 63.

The second phase detection circuit 60 includes the second frequency divider 54 and the second counter 61.

Similarly to the second phase detection circuit 13 illustrated in FIG. 1, the second phase detection circuit 60 calculates the second phase detection signal E2 indicating the phase of the output signal OUT.

The second counter 61 counts the number of pulses of the divided signal output from the second frequency divider 54, and outputs the number of pulses of the divided signal as the second phase detection signal E2 to the negative feedback signal generating circuit 63.

A shift circuit 62 includes the negative feedback signal generating circuit 63 and the adder 19.

Similarly to the shift circuit 17 illustrated in FIG. 1, the shift circuit 62 generates the negative feedback signal CAL and calculates the addition signal of the negative feedback signal CAL and the division ratio setting signal N_frac.

The negative feedback signal generating circuit 63 generates the negative feedback signal CAL from a difference between the number of pulses output from the first counter 59 and the number of pulses output from the second counter 61, and outputs the negative feedback signal CAL to the adder 19.

Next, the operation of the phase-locked loop circuit illustrated in FIG. 12 will be described.

Since components other than the first phase detection circuit 58, the second phase detection circuit 60, and the shift circuit 62 are similar to those of the phase-locked loop circuit illustrated in FIG. 1, here, the operation of the first phase detection circuit 58, the second phase detection circuit 60, and the shift circuit 62 will be described.

Upon receiving the output signal OUT of the VCO 6, the first frequency divider 52 divides the output signal OUT by M, and outputs the divided signal of the output signal OUT to the first counter 59.

The first counter 59 counts the number of pulses of the divided signal output from the first frequency divider 52, and outputs the number of pulses of the divided signal as the first phase detection signal E1 to the negative feedback signal generating circuit 63.

Upon receiving the reference signal REF, the second frequency divider 54 divides the reference signal REF by L, and outputs the divided signal of the reference signal REF to the second counter 61.

The second counter 61 counts the number of pulses of the divided signal output from the second frequency divider 54, and outputs the number of pulses of the divided signal as the second phase detection signal E2 to the negative feedback signal generating circuit 63.

The negative feedback signal generating circuit 63 calculates the difference between the number of pulses output from the first counter 59 and the number of pulses output from the second counter 61.

The difference in the number of pulses corresponds to the difference between the first phase detection signal E1 and the second phase detection signal E2.

The negative feedback signal generating circuit 63 generates the negative feedback signal CAL from the difference in the number of pulses and outputs the negative feedback signal CAL to the adder 19.

The adder 19 adds the division ratio setting signal N_frac and the negative feedback signal CAL output from the negative feedback signal generating circuit 63 together.

The adder 19 outputs the addition signal of the division ratio setting signal N_frac and the negative feedback signal CAL to the first ΔΣ modulator 9.

The operation principle of the phase-locked loop circuit illustrated in FIG. 12 is similar to the operation principle of the phase-locked loop circuits illustrated in FIGS. 1 and 10, and negative feedback is applied so that the first phase detection signal E1 becomes equal to the second phase detection signal E2.

Thus, the phase-locked loop circuit illustrated in FIG. 12 can output an output signal having the same phase as a phase of an output signal of another phase-locked loop circuit having the same configuration.

Since the negative feedback signal generating circuit 63 detects the difference by digital signal processing, the negative feedback signal generating circuit 63 has higher noise resistance than that of the negative feedback signal generating circuit 18 illustrated in FIG. 1 that detects the difference by analog signal processing.

Eighth Embodiment

In an eighth embodiment, a phase-locked loop circuit in which a first phase detection circuit 64 includes a first counter 65, and a second phase detection circuit 66 includes a second counter 67 will be described.

Figure 13:
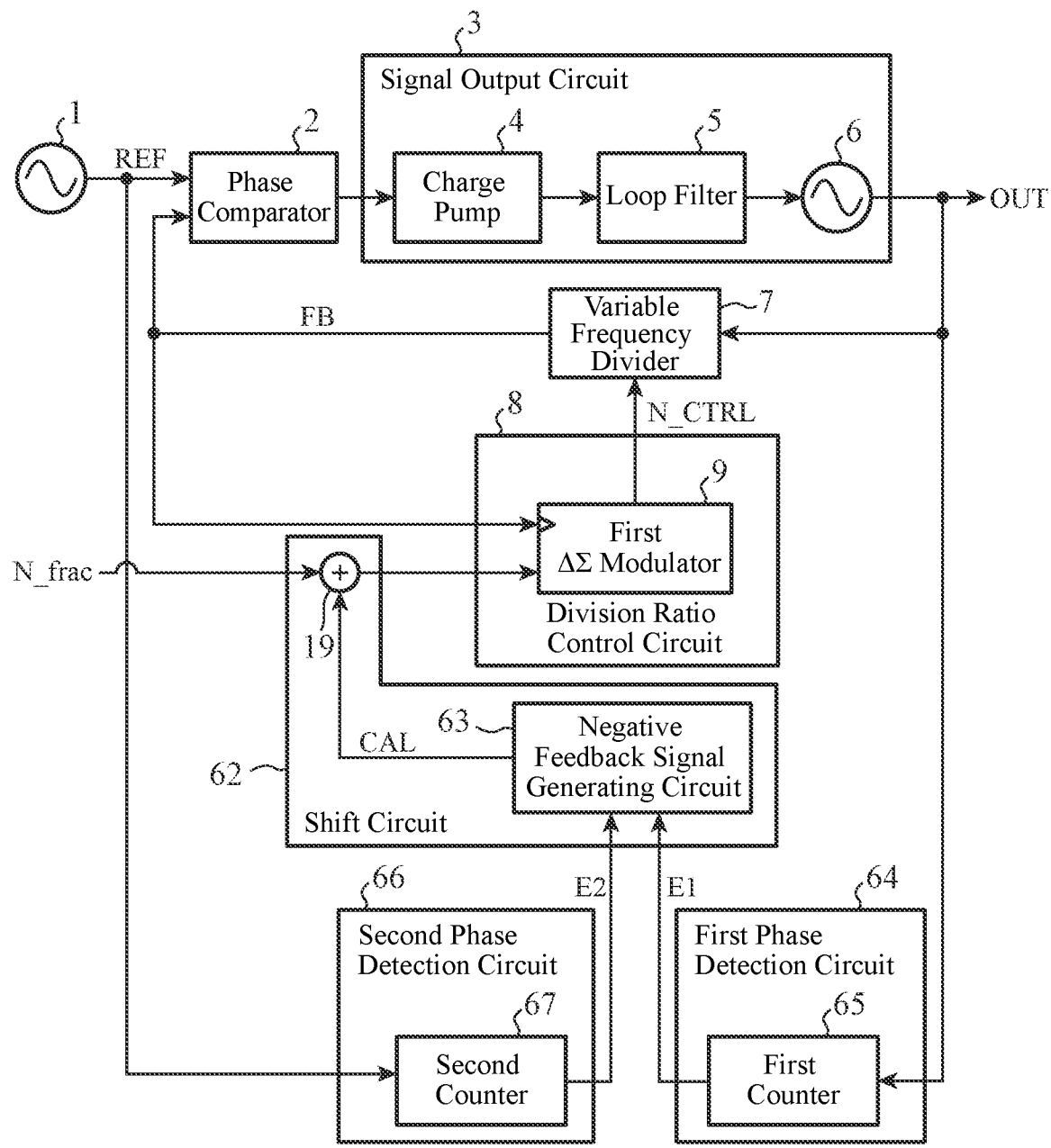
FIG. 13 is a configuration diagram illustrating a phase-locked loop circuit according to an eighth embodiment.

FIG. 13 is a configuration diagram illustrating the phase-locked loop circuit according to the eighth embodiment. In FIG. 13, since the same reference numerals as those in FIGS. 1 and 12 denote the same or corresponding portions, the description thereof will be omitted.

The first phase detection circuit 64 includes the first counter 65.

Similarly to the first phase detection circuit 10 illustrated in FIG. 1, the first phase detection circuit 64 calculates the first phase detection signal E1 indicating the phase of the output signal OUT of the VCO 6.

The first counter 65 counts the number of pulses of the output signal OUT of the VCO 6.

The first counter 65 multiplies the number of pulses of the output signal OUT by the reciprocal of the average division ratio of the output signal OUT of the variable frequency divider 7, and outputs the number of pulses after multiplication of the reciprocal of the division ratio as the first phase detection signal E1 to the negative feedback signal generating circuit 63.

The second phase detection circuit 66 includes the second counter 67.

Similarly to the second phase detection circuit 13 illustrated in FIG. 1, the second phase detection circuit 66 calculates the second phase detection signal E2 indicating the phase of the output signal OUT.

The second counter 67 counts the number of pulses of the reference signal REF, and outputs the number of pulses of the reference signal REF as the second phase detection signal E2 to the negative feedback signal generating circuit 63.

Next, the operation of the phase-locked loop circuit illustrated in FIG. 13 will be described.

Since components other than the first phase detection circuit 64 and the second phase detection circuit 66 are similar to those of the phase-locked loop circuit illustrated in FIG. 12, here, the operation of the first phase detection circuit 64 and the second phase detection circuit 66 will be mainly described.

Upon receiving the output signal OUT of the VCO 6, the first counter 65 counts the number of pulses of the output signal OUT.

The first counter 65 multiplies the number of pulses of the output signal OUT by the reciprocal of the average division ratio of the output signal OUT of the variable frequency divider 7, and outputs the number of pulses after multiplication of the reciprocal of the division ratio as the first phase detection signal E1 to the negative feedback signal generating circuit 63.

Upon receiving the reference signal REF, the second counter 67 counts the number of pulses of the reference signal REF, and outputs the number of pulses of the reference signal REF as the second phase detection signal E2 to the negative feedback signal generating circuit 63.

The negative feedback signal generating circuit 63 calculates a difference between the number of pulses output from the first counter 65 and the number of pulses output from the second counter 67.

The negative feedback signal generating circuit 63 generates the negative feedback signal CAL from the difference in the number of pulses and outputs the negative feedback signal CAL to the adder 19.

The adder 19 adds the division ratio setting signal N_frac and the negative feedback signal CAL output from the negative feedback signal generating circuit 63 together.

The adder 19 outputs the addition signal of the division ratio setting signal N_frac and the negative feedback signal CAL to the first ΔΣ modulator 9.

The operation principle of the phase-locked loop circuit illustrated in FIG. 13 is similar to the operation principle of the phase-locked loop circuits illustrated in FIGS. 1 and 12, and negative feedback is applied so that the first phase detection signal E1 becomes equal to the second phase detection signal E2.

Thus, the phase-locked loop circuit illustrated in FIG. 13 can output an output signal having the same phase as a phase of an output signal of another phase-locked loop circuit having the same configuration.

The first phase detection circuit 64 does not include the first frequency divider 52, and is smaller in circuit scale than the first phase detection circuit 58 illustrated in FIG. 12 by that amount of the first frequency divider 52.

Furthermore, the second phase detection circuit 66 does not include the second frequency divider 54, and is smaller in circuit scale than the second phase detection circuit 60 illustrated in FIG. 12 by the amount of the second frequency divider 54.

Ninth Embodiment

In a ninth embodiment, a phase-locked loop circuit in which a first phase detection circuit 68 includes a first counter 69, and the second phase detection circuit 66 includes the second counter 67 will be described.

Figure 14:
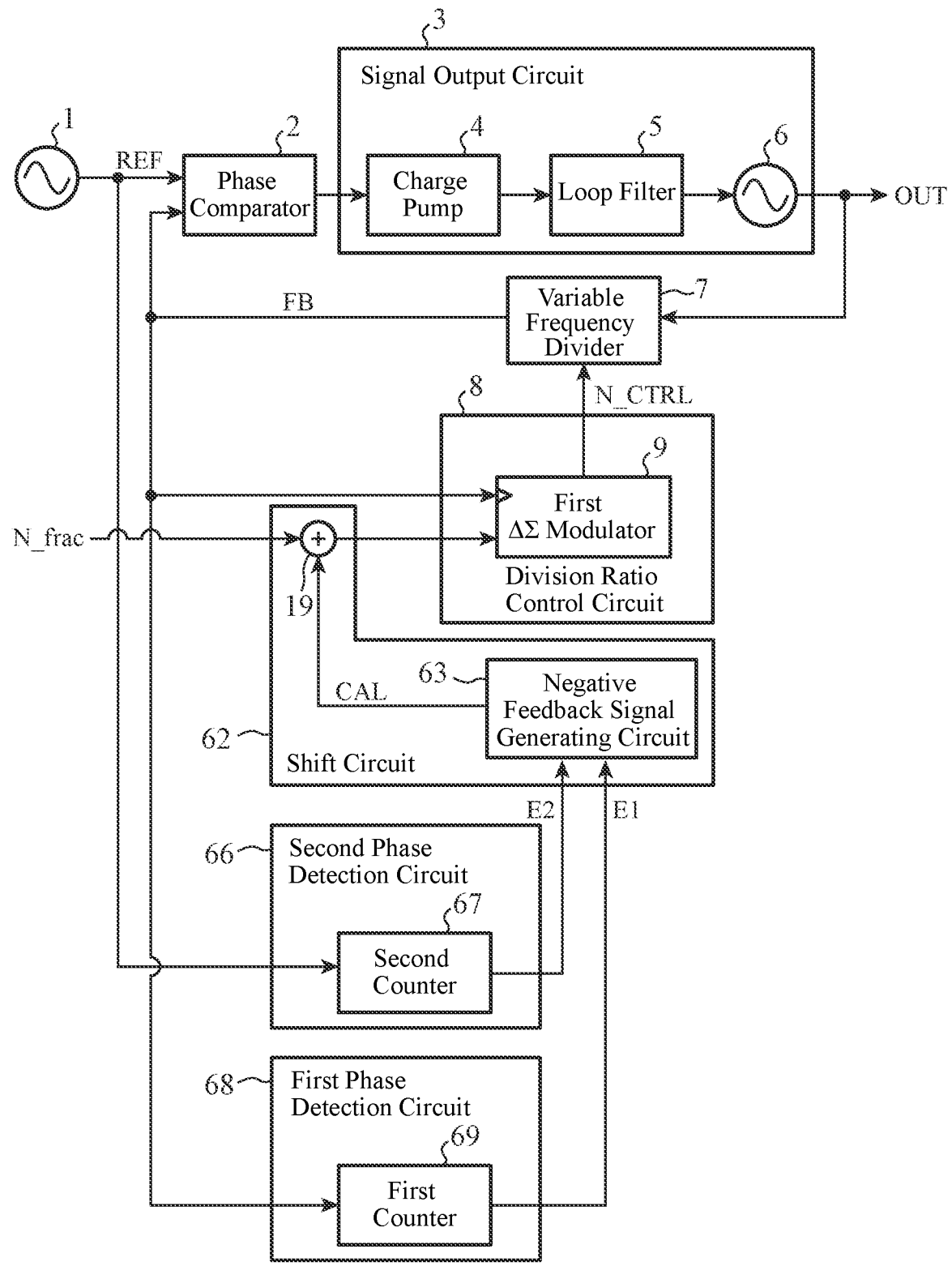
FIG. 14 is a configuration diagram illustrating a phase-locked loop circuit according to a ninth embodiment.

FIG. 14 is a configuration diagram illustrating the phase-locked loop circuit according to the ninth embodiment. In FIG. 14, since the same reference numerals as those in FIGS. 1 and 13 denote the same or corresponding portions, the description thereof will be omitted.

The first phase detection circuit 68 includes the first counter 69.

Similarly to the first phase detection circuit 10 illustrated in FIG. 1, the first phase detection circuit 68 calculates the first phase detection signal E1 indicating the phase of the output signal OUT of the VCO 6.

The first counter 69 counts the number of pulses of the divided signal FB output from the variable frequency divider 7, and outputs the number of pulses of the divided signal FB as the first phase detection signal E1 to the negative feedback signal generating circuit 63.

Next, the operation of the phase-locked loop circuit illustrated in FIG. 14 will be described.

Since components other than the first phase detection circuit 68 and the second phase detection circuit 66 are similar to those of the phase-locked loop circuit illustrated in FIG. 13, here, the operation of the first phase detection circuit 68 and the second phase detection circuit 66 will be mainly described.

Upon receiving the divided signal FB from the variable frequency divider 7, the first counter 69 counts the number of pulses of the divided signal FB, and outputs the number of pulses of the divided signal FB as the first phase detection signal E1 to the negative feedback signal generating circuit 63.

Upon receiving the reference signal REF, the second counter 67 counts the number of pulses of the reference signal REF, and outputs the number of pulses of the reference signal REF as the second phase detection signal E2 to the negative feedback signal generating circuit 63.

The negative feedback signal generating circuit 63 calculates a difference between the number of pulses output from the first counter 69 and the number of pulses output from the second counter 67.

The negative feedback signal generating circuit 63 generates the negative feedback signal CAL from the difference in the number of pulses and outputs the negative feedback signal CAL to the adder 19.

The adder 19 adds the division ratio setting signal N_frac and the negative feedback signal CAL output from the negative feedback signal generating circuit 63 together.

The adder 19 outputs the addition signal of the division ratio setting signal N_frac and the negative feedback signal CAL to the first ΔΣ modulator 9.

The operation principle of the phase-locked loop circuit illustrated in FIG. 14 is the same as the operation principle of the phase-locked loop circuits illustrated in FIGS. 1 and 13, and negative feedback is applied so that the first phase detection signal E1 becomes equal to the second phase detection signal E2.

Thus, the phase-locked loop circuit illustrated in FIG. 14 can output an output signal having the same phase as a phase of an output signal of another phase-locked loop circuit having the same configuration.

The first phase detection circuit 68 does not include the first frequency divider 52, and is smaller in circuit scale than the first phase detection circuit 58 illustrated in FIG. 12 by the amount of the first frequency divider 52.

Furthermore, the second phase detection circuit 66 does not include the second frequency divider 54, and is smaller in circuit scale than the second phase detection circuit 60 illustrated in FIG. 12 by the amount of the second frequency divider 54.

Since the first counter 69 counts the number of pulses of the divided signal FB output from the variable frequency divider 7, a required operation speed is reduced more than that required for the first counter 65 illustrated in FIG. 13 for counting the output signal OUT.

Tenth Embodiment

In a tenth embodiment, a phase-locked loop circuit that includes a delay control circuit 71 for controlling a delay of the first pulse train on the basis of the difference between the first phase detection signal E1 and the second phase detection signal E2 will be described.

Figure 15:
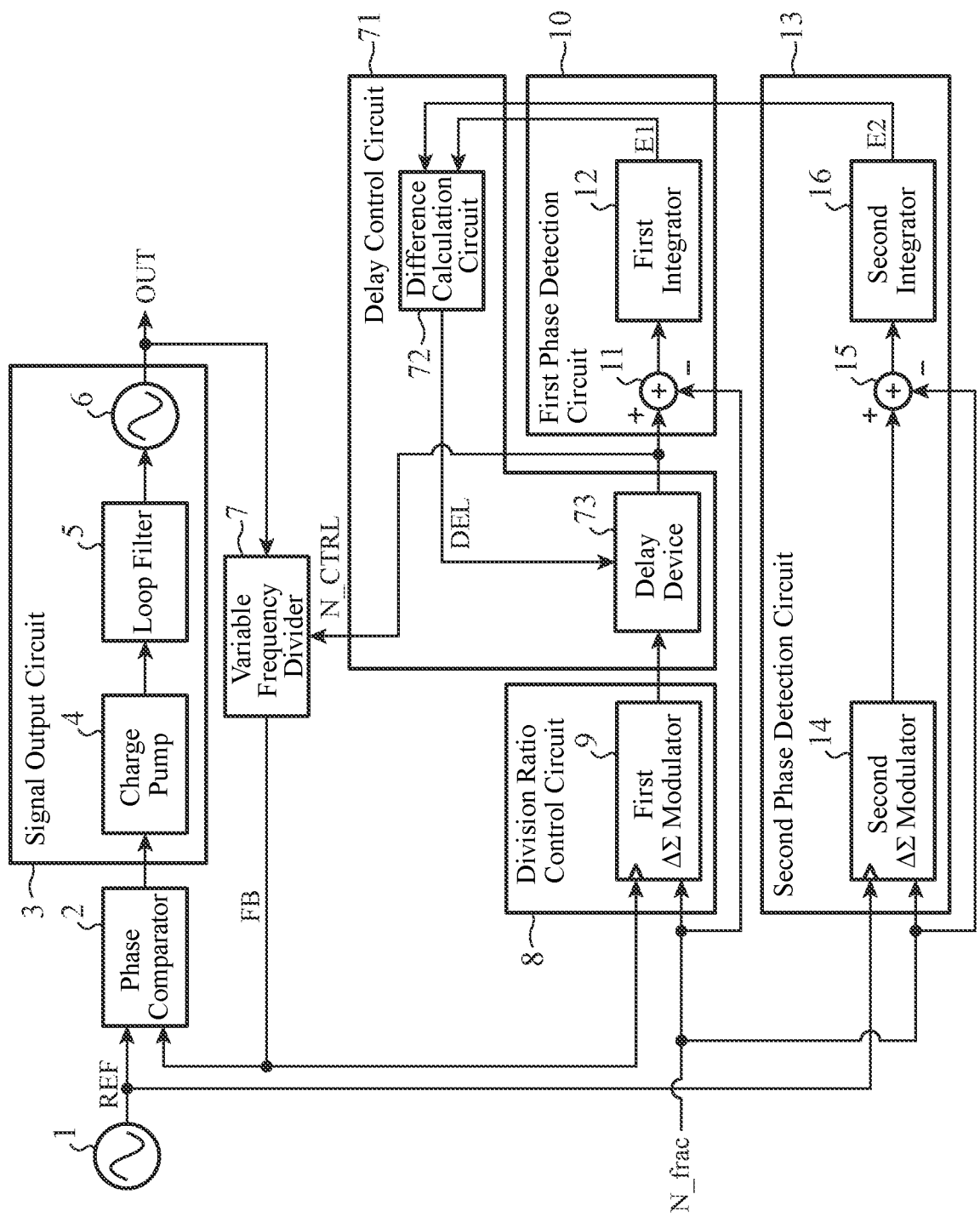
FIG. 15 is a configuration diagram illustrating a phase-locked loop circuit according to a tenth embodiment.

FIG. 15 is a configuration diagram illustrating the phase-locked loop circuit according to the tenth embodiment. In FIG. 15, since the same reference numerals as those in FIG. 1 denote the same or corresponding portions, the description thereof will be omitted.

The delay control circuit 71 includes a difference calculation circuit 72 and a delay device 73.

The delay control circuit 71 calculates the difference between the first phase detection signal E1 output from the first integrator 12 and the second phase detection signal E2 output from the second integrator 16.

The delay control circuit 71 delays the first pulse train output from the first ΔΣ modulator 9 on the basis of the difference between the first phase detection signal E1 and the second phase detection signal E2, and controls the division ratio of the output signal OUT of the variable frequency divider 7 by using the delayed first pulse train.

The difference calculation circuit 72 calculates the difference between the first phase detection signal E1 output from the first integrator 12 and the second phase detection signal E2 output from the second integrator 16, and outputs a delay time DEL corresponding to the difference to the delay device 73.

The delay device 73 delays the first pulse train output from the first ΔΣ modulator 9 by the delay time DEL output from the difference calculation circuit 72, and outputs the delayed first pulse train as the division ratio control signal N_CTRL to the variable frequency divider 7.

Next, the operation of the phase-locked loop circuit illustrated in FIG. 15 will be described.

Since components other than the first ΔΣ modulator 9 and the delay control circuit 71 are similar to those of the phase-locked loop circuit illustrated in FIG. 1, here, the operation of the first ΔΣ modulator 9 and the delay control circuit 71 will be mainly described.

The first ΔΣ modulator 9 generates the first pulse train used for controlling the division ratio of the output signal OUT of the variable frequency divider 7 by performing the ΔΣ modulaton of the division ratio setting signal N_frac, in synchronization with the divided signal FB output from the variable frequency divider 7.

The first ΔΣ modulator 9 outputs the first pulse train to the delay device 73.

Upon receiving the first pulse train from the first ΔΣ modulator 9, the delay device 73 delays the first pulse train by the delay time DEL output from the difference calculation circuit 72, and outputs the delayed first pulse train to the first subtractor 11.

Furthermore, the delay device 73 outputs the delayed first pulse train as the division ratio control signal N_CTRL to the variable frequency divider 7.

Upon receiving the first pulse train from the delay device 73, the first subtractor 11 subtracts the division ratio setting signal N_frac from the first pulse train, and outputs a subtraction signal indicating a result of the subtraction to the first integrator 12.

The first integrator 12 calculates the first phase detection signal E1 by integrating the subtraction signal output from the first subtractor 11, and outputs the first phase detection signal E1 to the difference calculation circuit 72.

The difference calculation circuit 72 calculates the difference between the first phase detection signal E1 output from the first integrator 12 and the second phase detection signal E2 output from the second integrator 16.

The difference calculation circuit 72 outputs the delay time DEL corresponding to the difference to the delay device 73 so that the difference between the first phase detection signal E1 and the second phase detection signal E2 becomes zero.

That is, if E1<E2, the difference calculation circuit 72 outputs, to the delay device 73, a delay time longer than the delay time DEL output to the delay device 73 last time.

If E1>E2, the difference calculation circuit 72 outputs, to the delay device 73, a delay time shorter than the delay time DEL output to the delay device 73 last time.

If E1=E2, the difference calculation circuit 72 outputs, to the delay device 73, the same delay time as the delay time DEL output to the delay device 73 last time.

The delay device 73 delays the first pulse train output from the first ΔΣ modulator 9 by the delay time DEL output from the difference calculation circuit 72, and outputs the delayed first pulse train as the division ratio control signal N_CTRL to the variable frequency divider 7.

Furthermore, the delay device 73 outputs the delayed first pulse train to the first subtractor 11.

The phase-locked loop circuit illustrated in FIG. 15 delays the first pulse train output from the first ΔΣ modulator 9, and is different in this point from the phase-locked loop circuit illustrated in FIG. 1 in which the negative feedback signal CAL is added to the division ratio setting signal N_frac that is the input signal of the first ΔΣ modulator 9.

However, the phase-locked loop circuit illustrated in FIG. 15 is similar to the phase-locked loop circuit illustrated in FIG. 1 in that negative feedback is applied so that the first phase detection signal E1 becomes equal to the second phase detection signal E2.

In the tenth embodiment described above, the phase-locked loop circuit includes: a division ratio control circuit 8 generating a first pulse train to be used for controlling a division ratio of the output signal of the variable frequency divider 7 from a division ratio setting signal indicating the division ratio, in synchronization with the divided signal output from the variable frequency divider 7; a first phase detection circuit 10 calculating a first phase detection signal indicating a phase of the output signal of the signal output circuit 3; a second phase detection circuit 13 calculating a second phase detection signal indicating a phase of the output signal of a case where it is assumed that the division ratio control circuit 8 generates the first pulse train in synchronization with the reference signal; and a delay control circuit 71 delaying the first pulse train on a basis of a difference between the first phase detection signal and the second phase detection signal, and controlling the division ratio of the output signal of the variable frequency divider 7 by a delayed first pulse train. Thus, the phase-locked loop circuit of the tenth embodiment can output an output signal having the same phase as a phase of an output signal of another phase-locked loop circuit having the same configuration.

Note that, in the invention of the present application, within the scope of the invention, free combination of embodiments, a modification of any component of each embodiment, or omission of any component in each embodiment is possible.

INDUSTRIAL APPLICABILITY

The present invention is suitable for a phase-locked loop circuit for outputting a signal having a frequency corresponding to a phase difference between a reference signal and a divided signal.

REFERENCE SIGNS LIST

1: signal source, 2: phase comparator, 3: signal output circuit, 4: charge pump, 5: loop filter, 6: VCO, 7: variable frequency divider, 8: division ratio control circuit, 9: first ΔΣ modulator, 10: first phase detection circuit, 11: first subtractor, 12: first integrator, 13: second phase detection circuit, 14: second ΔΣ modulator, 15: second subtractor, 16: second integrator, 17: shift circuit, 18: negative feedback signal generating circuit, 19: adder, 21: division ratio control circuit, 22: first phase detection circuit, 23: first first-order ΔΣ modulator, 24: third ΔΣ modulator, 25: combiner, 26: second phase detection circuit, 27: second first-order ΔΣ modulator, 28: shift circuit, 29: negative feedback signal generating circuit, 31, 35: subtractor, 32, 34: adder, 33: flip-flop, 41: shift circuit, 42: second phase comparator, 43: filter, 51: first phase detection circuit, 52: first frequency divider, 53: second phase detection circuit, 54: second frequency divider, 55: shift circuit, 56: second phase comparator, 57: filter, 58: first phase detection circuit, 59: first counter, 60: second phase detection circuit, 61: second counter, 62: shift circuit, 63: negative feedback signal generating circuit, 64: first phase detection circuit, 65: first counter, 66: second phase detection circuit, 67: second counter, 68: first phase detection circuit, 69: first counter, 71: delay control circuit, 72: difference calculation circuit, 73: delay device

The invention claimed is:

1. A phase-locked loop circuit comprising:
   a phase comparator detecting a phase difference between a reference signal and a divided signal;
   a signal output circuit outputting an output signal having a frequency corresponding to the phase difference detected by the phase comparator;
   a variable frequency divider generating the divided signal by dividing the output signal of the signal output circuit and outputting the divided signal of the output signal to the phase comparator;
   a division ratio control circuit controlling a division ratio of the divided signal to be output by the variable frequency divider on a basis of an addition signal in which a negative feedback signal is added to a division ratio setting signal indicating a division ratio, in synchronization with the divided signal output from the variable frequency divider;
   a first phase detection circuit calculating a first phase detection signal indicating a phase of the output signal of the signal output circuit;
   a second phase detection circuit calculating a second phase detection signal indicating a phase of the output signal of the variable frequency divider in a case where it is assumed that the division ratio control circuit controls the division ratio of the divided signal to be output by the variable frequency divider in synchronization with the reference signal; and
   a shift circuit generating the negative feedback signal from a difference between the first phase detection signal and the second phase detection signal, and outputting the addition signal of the negative feedback signal and the division ratio setting signal to the division ratio control circuit.

2. The phase-locked loop circuit according to claim 1, wherein the division ratio control circuit is a first ΔΣ modulator generating a first pulse train indicating the division ratio of the output signal of the variable frequency divider by performing ΔΣ modulation of the addition signal, in synchronization with the divided signal output from the variable frequency divider.

3. The phase-locked loop circuit according to claim 2, wherein the first phase detection circuit includes:

a first subtractor performing subtraction subtracting the addition signal from the first pulse train generated by the first ΔΣ modulator; and a first integrator calculating the first phase detection signal by integrating a result of the subtraction performed by the first subtractor, and the second phase detection circuit includes:

a second ΔΣ modulator generating a second pulse train by performing ΔΣ modulation of the division ratio setting signal, in synchronization with the reference signal;

a second subtractor performing subtraction subtracting the division ratio setting signal from the second pulse train generated by the second ΔΣ modulator; and a second integrator calculating the second phase detection signal by integrating a result of the subtraction performed by the second subtractor.

4. The phase-locked loop circuit according to claim 1, wherein a first first-order ΔΣ modulator performing ΔΣ modulation of the addition signal in synchronization with the divided signal output from the variable frequency divider is included in the division ratio control circuit, and the first first-order ΔΣ modulator is included in the first phase detection circuit, the division ratio control circuit includes:

a third ΔΣ modulator performing ΔΣ modulaton of an error output of the ΔΣ modulation in the first first-order ΔΣ modulator in synchronization with the divided signal output from the variable frequency divider; and a combiner controlling the division ratio of the divided signal to be output by the variable frequency divider on a basis of a carry output of the ΔΣ modulaton in the first first-order ΔΣ modulator and a carry output of the ΔΣ modulaton in the third ΔΣ modulator, the second phase detection circuit is a second first-order ΔΣ modulator performing ΔΣ modulaton of the division ratio setting signal in synchronization with the reference signal, and the shift circuit includes:

a negative feedback signal generating circuit generating a negative feedback signal from a difference between the error output of the ΔΣ modulaton in the first first-order ΔΣ modulator and an error output of the ΔΣ modulaton in the second first-order ΔΣ modulator; and an adder outputting the addition signal of the negative feedback signal generated by the negative feedback signal generating circuit and the division ratio setting signal, to the first first-order ΔΣ modulator.

5. The phase-locked loop circuit according to claim 1, wherein a first first-order ΔΣ modulator for performing ΔΣ modulaton of the addition signal in synchronization with the divided signal output from the variable frequency divider is included in the division ratio control circuit, and the first first-order ΔΣ modulator is included in the first phase detection circuit, the division ratio control circuit includes:

a third ΔΣ modulator performing ΔΣ modulaton of an error output in the ΔΣ modulation of the first first-order ΔΣ modulator in synchronization with the divided signal output from the variable frequency divider; and a combiner controlling the division ratio of the divided signal to be output by the variable frequency divider on a basis of a carry output of the ΔΣ modulaton in the first first-order ΔΣ modulator and a carry output of the ΔΣ modulaton in the third ΔΣ modulator, the second phase detection circuit is a second first-order ΔΣ modulator performing ΔΣ modulaton of the division ratio setting signal in synchronization with the reference signal, and the shift circuit includes:

a second phase comparator detecting a phase difference between the carry output of the ΔΣ modulaton in the first first-order ΔΣ modulator and a carry output of the ΔΣ modulaton in the second first-order ΔΣ modulator;

a filter generating a negative feedback signal from the phase difference detected by the second phase comparator; and an adder outputting an addition signal of the negative feedback signal generated by the filter and the division ratio setting signal to the first first-order ΔΣ modulator.

6. The phase-locked loop circuit according to claim 1, wherein the first phase detection circuit is a first first-order ΔΣ modulator calculating the first phase detection signal by performing ΔΣ modulaton of the addition signal, in synchronization with the divided signal output from the variable frequency divider, the second phase detection circuit is a second first-order ΔΣ modulator calculating the second phase detection signal by performing ΔΣ modulaton of the division ratio setting signal, in synchronization with the reference signal, and the shift circuit includes:

a negative feedback signal generating circuit generating a negative feedback signal from a difference between the error output of the ΔΣ modulaton in the first first-order ΔΣ modulator and an error output of the ΔΣ modulaton in the second first-order ΔΣ modulator; and an adder outputting the addition signal of the negative feedback signal generated by the negative feedback signal generating circuit and the division ratio setting signal, to the first first-order ΔΣ modulator.

7. The phase-locked loop circuit according to claim 1, wherein the first phase detection circuit is a first first-order ΔΣ modulator calculating the first phase detection signal by performing ΔΣ modulaton of the addition signal, in synchronization with the divided signal output from the variable frequency divider, the second phase detection circuit is a second first-order ΔΣ modulator calculating the second phase detection signal by performing ΔΣ modulaton of the division ratio setting signal, in synchronization with the reference signal, and the shift circuit includes:

a second phase comparator detecting a phase difference between the carry output of the ΔΣ modulaton in the first first-order ΔΣ modulator and a carry output of the ΔΣ modulaton in the second first-order ΔΣ modulator;

a filter generating a negative feedback signal from the phase difference detected by the second phase comparator; and an adder outputting an addition signal of the negative feedback signal generated by the filter and the division ratio setting signal to the first first-order ΔΣ modulator.

8. The phase-locked loop circuit according to claim 1, wherein the first phase detection circuit is a first frequency divider generating and outputting a divided signal of the output signal by dividing the output signal of the signal output circuit, the second phase detection circuit is a second frequency divider generating and outputting a divided signal of the reference signal by dividing the reference signal, and the shift circuit includes:
a second phase comparator detecting a phase difference between the divided signal output from the first frequency divider and the divided signal output from the second frequency divider;
a filter generating a negative feedback signal from the phase difference detected by the second phase comparator; and
an adder outputting an addition signal of the negative feedback signal generated by the filter and the division ratio setting signal to the division ratio control circuit.

9. The phase-locked loop circuit according to claim 1, wherein the first phase detection circuit includes:
a first frequency divider generating and outputting a divided signal of the output signal by dividing the output signal of the signal output circuit;
a first counter counting and outputting the number of pulses of the divided signal output from the first frequency divider,
the second phase detection circuit includes:
a second frequency divider generating and outputting a divided signal of the reference signal by dividing the reference signal; and
a second counter counting and outputting the number of pulses of the divided signal output from the second frequency divider,
the shift circuit includes:
a negative feedback signal generating circuit generating a negative feedback signal from a difference between the number of pulses output from the first counter and the number of pulses output from the second counter; and
an adder outputting an addition signal of the negative feedback signal generated by the negative feedback signal generating circuit and the division ratio setting signal to the division ratio control circuit.

10. The phase-locked loop circuit according to claim 1, wherein the first phase detection circuit is a first counter counting and outputting the number of pulses of the output signal of the signal output circuit,
the second phase detection circuit is a second counter counting and outputting the number of pulses of the reference signal, and
the shift circuit includes:
a negative feedback signal generating circuit generating a negative feedback signal on a basis of the number of pulses output from the first counter and the number of pulses output from the second counter; and
an adder outputting an addition signal of the negative feedback signal generated by the negative feedback signal generating circuit and the division ratio setting signal to the division ratio control circuit.

11. The phase-locked loop circuit according to claim 1, wherein the first phase detection circuit is a first counter counting and outputting the number of pulses of the divided signal output from the variable frequency divider,
the second phase detection circuit is a second counter counting and outputting the number of pulses of the reference signal, and
the shift circuit includes:
a negative feedback signal generating circuit generating a negative feedback signal from a difference between the number of pulses output from the first counter and the number of pulses output from the second counter; and
an adder outputting an addition signal of the negative feedback signal generated by the negative feedback signal generating circuit and the division ratio setting signal to the division ratio control circuit.

12. A phase-locked loop circuit comprising:
a phase comparator detecting a phase difference between a reference signal and a divided signal;
a signal output circuit outputting a signal having a frequency corresponding to the phase difference detected by the phase comparator;
a variable frequency divider generating the divided signal by dividing an output signal of the signal output circuit and outputting the divided signal to the phase comparator;
a division ratio control circuit generating a first pulse train to be used for controlling a division ratio of the output signal of the variable frequency divider from a division ratio setting signal indicating the division ratio, in synchronization with the divided signal output from the variable frequency divider;
a first phase detection circuit calculating a first phase detection signal indicating a phase of the output signal of the signal output circuit;
a second phase detection circuit calculating a second phase detection signal indicating a phase of the output signal of a case where it is assumed that the division ratio control circuit generates the first pulse train in synchronization with the reference signal; and
a delay control circuit delaying the first pulse train on a basis of a difference between the first phase detection signal and the second phase detection signal, and controlling the division ratio of the output signal of the variable frequency divider by a delayed first pulse train.

13. The phase-locked loop circuit according to claim 12, wherein the division ratio control circuit is a first ΔΣ modulator generating the first pulse train by performing ΔΣ modulation of the division ratio setting signal, in synchronization with the divided signal output from the variable frequency divider,
the delay control circuit includes:
a difference calculation circuit calculating the difference between the first phase detection signal and the second phase detection signal; and
a delay device generating a delayed first pulse train by delaying the first pulse train by a time corresponding to the difference calculated by the difference calculation circuit and outputting the delayed first pulse train to the variable frequency divider,
the first phase detection circuit includes:
a first subtractor performing subtraction subtracting the division ratio setting signal from the delayed first pulse train; and
a first integrator calculating the first phase detection signal by integrating a result of the subtraction performed by the first subtractor,
the second phase detection circuit includes:
a second ΔΣ modulator generating a second pulse train by performing ΔΣ modulation of the division ratio setting signal, in synchronization with the reference signal;
a second subtractor performing subtraction subtracting the division ratio setting signal from the second pulse train generated by the second ΔΣ modulator; and
a second integrator calculating the second phase detection signal by integrating a result of the subtraction performed by the second subtractor.

* * * * *